United States Patent
Melanson

(10) Patent No.: US 7,888,922 B2
(45) Date of Patent: Feb. 15, 2011

(54) POWER FACTOR CORRECTION CONTROLLER WITH SWITCH NODE FEEDBACK

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 380 days.

(21) Appl. No.: 11/967,272

(22) Filed: Dec. 31, 2007

(65) Prior Publication Data

US 2008/0272746 A1 Nov. 6, 2008

Related U.S. Application Data

(60) Provisional application No. 60/915,547, filed on May 2, 2007.

(51) Int. Cl.
*G05F 1/10* (2006.01)
*G05F 1/652* (2006.01)
(52) U.S. Cl. ............... 323/282; 323/283; 323/284; 323/286; 323/222; 323/223
(58) Field of Classification Search .......... 323/282, 323/283, 284, 286, 222, 223, 224
See application file for complete search history.

(56) References Cited

U.S. PATENT DOCUMENTS

| | | | |
|---|---|---|---|
| 3,316,495 A | 4/1967 | Sherer | |
| 3,423,689 A | 1/1969 | Miller et al. | |
| 3,586,988 A | 6/1971 | Weekes | |
| 3,725,804 A | 4/1973 | Langan | |
| 3,790,878 A | 2/1974 | Brokaw | |
| 3,881,167 A | 4/1975 | Pelton et al. | |
| 4,075,701 A | 2/1978 | Hofmann | |
| 4,334,250 A | 6/1982 | Theus | |

(Continued)

FOREIGN PATENT DOCUMENTS

EP 0585789 A1 3/1994

(Continued)

OTHER PUBLICATIONS

International Search Report and Written Opinion for PCT/US2008/062384 dated Jan. 14, 2008.

(Continued)

*Primary Examiner*—Bao Q Vu
(74) *Attorney, Agent, or Firm*—Hamilton & Terrile, LLP; Kent B. Chambers

(57) ABSTRACT

A power control system includes a switching power converter and a power factor correction (PFC) and output voltage controller. The PFC and output voltage controller provides a control signal to a switch to control power factor correction and regulate output voltage of the switching power converter. During a single period of the control signal, the PFC and output voltage controller determines the line input voltage, the output voltage, or both using a single feedback signal received from the switching power converter. The feedback signal is received from a switch node located between an inductor and the switch. The PFC and output voltage controller determines either the line input voltage or the output voltage, whichever was not determined from the feedback signal, using a second feedback signal received from either a PFC stage or a driver stage of the switching power converter.

20 Claims, 13 Drawing Sheets

U.S. PATENT DOCUMENTS

| | | | |
|---|---|---|---|
| 4,414,493 A | 11/1983 | Henrich |
| 4,476,706 A | 10/1984 | Hadden et al. |
| 4,677,366 A | 6/1987 | Wilkinson et al. |
| 4,683,529 A | 7/1987 | Bucher |
| 4,700,188 A | 10/1987 | James |
| 4,737,658 A | 4/1988 | Kronmuller et al. |
| 4,797,633 A | 1/1989 | Humphrey |
| 4,940,929 A | 7/1990 | Williams |
| 4,973,919 A | 11/1990 | Allfather |
| 4,979,087 A | 12/1990 | Sellwood et al. |
| 4,992,919 A | 2/1991 | Lee et al. |
| 4,994,952 A | 2/1991 | Silva et al. |
| 5,206,540 A | 4/1993 | de Sa e Silva et al. |
| 5,278,490 A | 1/1994 | Smedley |
| 5,323,157 A | 6/1994 | Ledzius et al. |
| 5,359,180 A | 10/1994 | Park et al. |
| 5,383,109 A | 1/1995 | Maksimovic et al. |
| 5,477,481 A | 12/1995 | Kerth |
| 5,481,178 A | 1/1996 | Wilcox et al. |
| 5,565,761 A | 10/1996 | Hwang |
| 5,638,265 A | 6/1997 | Gabor |
| 5,691,890 A | 11/1997 | Hyde |
| 5,747,977 A | 5/1998 | Hwang |
| 5,764,039 A | 6/1998 | Choi et al. |
| 5,781,040 A | 7/1998 | Myers |
| 5,783,909 A | 7/1998 | Hochstein |
| 5,900,683 A | 5/1999 | Rinehart et al. |
| 5,929,400 A | 7/1999 | Colby et al. |
| 5,946,202 A | 8/1999 | Balogh |
| 5,952,849 A | 9/1999 | Haigh et al. |
| 5,960,207 A | 9/1999 | Brown |
| 5,963,086 A | 10/1999 | Hall |
| 5,966,297 A | 10/1999 | Minegishi |
| 5,994,885 A | 11/1999 | Wilcox et al. |
| 6,016,038 A | 1/2000 | Mueller et al. |
| 6,043,633 A | 3/2000 | Lev et al. |
| 6,072,969 A | 6/2000 | Yokomori et al. |
| 6,083,276 A | 7/2000 | Davidson et al. |
| 6,084,450 A | 7/2000 | Smith et al. |
| 6,150,774 A | 11/2000 | Mueller et al. |
| 6,211,626 B1 | 4/2001 | Lys et al. |
| 6,211,627 B1 | 4/2001 | Callahan |
| 6,229,271 B1 | 5/2001 | Liu |
| 6,246,183 B1 | 6/2001 | Buonavita |
| 6,259,614 B1 | 7/2001 | Ribarich et al. |
| 6,300,723 B1 | 10/2001 | Wang et al. |
| 6,304,066 B1 | 10/2001 | Wilcox et al. |
| 6,304,473 B1 | 10/2001 | Telefus et al. |
| 6,344,811 B1 | 2/2002 | Melanson |
| 6,385,063 B1 | 5/2002 | Sadek et al. |
| 6,407,691 B1 | 6/2002 | Yu |
| 6,441,558 B1 | 8/2002 | Muthu et al. |
| 6,445,600 B2 | 9/2002 | Ben-Yaakov |
| 6,452,521 B1 | 9/2002 | Wang |
| 6,495,964 B1 | 12/2002 | Muthu |
| 6,509,913 B2 | 1/2003 | Martin, Jr. et al. |
| 6,580,258 B2 | 6/2003 | Wilcox et al. |
| 6,583,550 B2 | 6/2003 | Iwasa et al. |
| 6,636,003 B2 | 10/2003 | Rahm et al. |
| 6,688,753 B2 | 2/2004 | Calon et al. |
| 6,713,974 B2 | 3/2004 | Patchornik et al. |
| 6,727,832 B1 | 4/2004 | Melanson |
| 6,741,123 B1 | 5/2004 | Andersen et al. |
| 6,753,661 B2 | 6/2004 | Muthu et al. |
| 6,768,655 B1 | 7/2004 | Yang et al. |
| 6,781,351 B2 | 8/2004 | Mednik et al. |
| 6,788,011 B2 | 9/2004 | Mueller et al. |
| 6,806,659 B1 | 10/2004 | Mueller et al. |
| 6,839,247 B1 | 1/2005 | Yang |
| 6,860,628 B2 | 3/2005 | Robertson et al. |
| 6,870,325 B2 | 3/2005 | Bushell et al. |
| 6,873,065 B2 | 3/2005 | Haigh et al. |
| 6,882,552 B2 | 4/2005 | Telefus et al. |
| 6,888,322 B2 | 5/2005 | Dowling et al. |
| 6,894,471 B2 | 5/2005 | Corva et al. |
| 6,933,706 B2 | 8/2005 | Shih |
| 6,940,733 B2 | 9/2005 | Schie et al. |
| 6,944,034 B1 | 9/2005 | Shytenberg et al. |
| 6,956,750 B1 | 10/2005 | Eason et al. |
| 6,958,920 B2 | 10/2005 | Mednik et al. |
| 6,967,448 B2 | 11/2005 | Morgan et al. |
| 6,970,503 B1 | 11/2005 | Kalb |
| 6,975,079 B2 | 12/2005 | Lys et al. |
| 7,003,023 B2 | 2/2006 | Krone et al. |
| 7,050,509 B2 | 5/2006 | Krone et al. |
| 7,064,498 B2 | 6/2006 | Dowling et al. |
| 7,064,531 B1 | 6/2006 | Zinn |
| 7,075,329 B2 | 7/2006 | Chen et al. |
| 7,078,963 B1 | 7/2006 | Andersen et al. |
| 7,088,059 B2 | 8/2006 | McKinney et al. |
| 7,102,902 B1 | 9/2006 | Brown et al. |
| 7,106,603 B1 | 9/2006 | Lin et al. |
| 7,109,791 B1 | 9/2006 | Epperson et al. |
| 7,126,288 B2 | 10/2006 | Ribarich et al. |
| 7,135,824 B2 | 11/2006 | Lys et al. |
| 7,145,295 B1 | 12/2006 | Lee et al. |
| 7,158,633 B1 | 1/2007 | Hein |
| 7,161,816 B2 | 1/2007 | Shytenberg et al. |
| 7,183,957 B1 | 2/2007 | Melanson |
| 7,221,130 B2 | 5/2007 | Ribeiro et al. |
| 7,233,135 B2 | 6/2007 | Noma et al. |
| 7,246,919 B2 | 7/2007 | Porchia et al. |
| 7,255,457 B2 | 8/2007 | Ducharm et al. |
| 7,266,001 B1 | 9/2007 | Notohamiprodjo et al. |
| 7,288,902 B1 | 10/2007 | Melanson |
| 7,292,013 B1 | 11/2007 | Chen et al. |
| 7,310,244 B2 | 12/2007 | Yang et al. |
| 7,375,476 B2 | 5/2008 | Walter et al. |
| 7,511,437 B2 | 3/2009 | Lys et al. |
| 7,538,499 B2 | 5/2009 | Ashdown |
| 7,545,130 B2 | 6/2009 | Latham |
| 7,554,473 B2 | 6/2009 | Melanson |
| 7,569,996 B2 | 8/2009 | Holmes et al. |
| 7,656,103 B2 | 2/2010 | Shteynberg et al. |
| 2002/0145041 A1 | 10/2002 | Muthu et al. |
| 2002/0150151 A1 | 10/2002 | Krone et al. |
| 2002/0166073 A1 | 11/2002 | Nguyen et al. |
| 2003/0095013 A1 | 5/2003 | Melanson et al. |
| 2003/0223255 A1 | 12/2003 | Ben-Yaakov |
| 2004/0046683 A1 | 3/2004 | Mitamura et al. |
| 2004/0085030 A1 | 5/2004 | Laflamme et al. |
| 2004/0085117 A1 | 5/2004 | Melbert et al. |
| 2004/0169477 A1 | 9/2004 | Yanai et al. |
| 2004/0227571 A1 | 11/2004 | Kuribayashi |
| 2004/0228116 A1 | 11/2004 | Miller et al. |
| 2004/0232971 A1 | 11/2004 | Kawasaki et al. |
| 2004/0239262 A1 | 12/2004 | Ido et al. |
| 2005/0057237 A1 | 3/2005 | Clavel |
| 2005/0156770 A1 | 7/2005 | Melanson |
| 2005/0184895 A1 | 8/2005 | Petersen et al. |
| 2005/0207190 A1 | 9/2005 | Gritter |
| 2005/0218838 A1 | 10/2005 | Lys |
| 2005/0253533 A1 | 11/2005 | Lys et al. |
| 2005/0270813 A1 | 12/2005 | Zhang et al. |
| 2005/0275354 A1 | 12/2005 | Hausman, Jr. et al. |
| 2005/0275386 A1 | 12/2005 | Jepsen et al. |
| 2006/0022916 A1 | 2/2006 | Aiello |
| 2006/0023002 A1 | 2/2006 | Hara et al. |
| 2006/0125420 A1 | 6/2006 | Boone et al. |
| 2006/0226795 A1 | 10/2006 | Walter et al. |
| 2006/0238136 A1 | 10/2006 | Johnson III et al. |
| 2006/0261754 A1 | 11/2006 | Lee |
| 2007/0029946 A1 | 2/2007 | Yu et al. |
| 2007/0040512 A1 | 2/2007 | Jungwirth et al. |

| | | | |
|---|---|---|---|
| 2007/0053182 | A1 | 3/2007 | Robertson |
| 2007/0103949 | A1 | 5/2007 | Tsuruya |
| 2007/0124615 | A1 | 5/2007 | Orr |
| 2007/0182699 | A1 | 8/2007 | Ha et al. |
| 2008/0130322 | A1 | 6/2008 | Artusi et al. |
| 2008/0174372 | A1 | 7/2008 | Tucker et al. |
| 2008/0192509 | A1 | 8/2008 | Dhuyvetter et al. |
| 2008/0224635 | A1 | 9/2008 | Hayes |
| 2008/0232141 | A1 | 9/2008 | Artusi et al. |
| 2008/0259655 | A1 | 10/2008 | Wei et al. |
| 2008/0278132 | A1 | 11/2008 | Kesterson et al. |
| 2009/0147544 | A1 | 6/2009 | Melanson |
| 2009/0218960 | A1 | 9/2009 | Lyons et al. |

FOREIGN PATENT DOCUMENTS

| | | |
|---|---|---|
| EP | 0910168 A1 | 4/1999 |
| EP | 1014563 | 6/2000 |
| EP | 1164819 A | 12/2001 |
| EP | 1213823 A2 | 6/2002 |
| EP | 1528785 A | 5/2005 |
| GB | 2069269 A | 8/1981 |
| WO | 01/15316 A1 | 1/2001 |
| WO | 01/97384 A | 12/2001 |
| WO | 02/15386 A2 | 2/2002 |
| WO | 0227944 | 4/2002 |
| WO | 02/091805 A2 | 11/2002 |
| WO | WO 2006/022107 A2 | 3/2006 |
| WO | 2006/067521 A | 6/2006 |
| WO | WO2006135584 | 12/2006 |
| WO | 2007/026170 A | 3/2007 |
| WO | 2007/079362 A | 7/2007 |

OTHER PUBLICATIONS

S. Dunlap et al., Design of Delta-Sigma Modulated Switching Power Supply, Circuits & Systems, Proceedings of the 1998 IEEE International Symposium, 1998.
Infineon, CCM-PFC Standalone Power Factor Correction (PFC) Controller in Continuous Conduction Mode (CCM), Version 2.1, Feb. 6, 2007.
International Rectifier, IRAC1150-300W Demo Board, User's Guide, Rev 3.0, Aug. 2, 2005.
International Rectifier, Application Note AN-1077,PFC Converter Design with IR1150 One Cycle Control IC, rev. 2.3, Jun. 2005.
International Rectifier, Data Sheet PD60230 revC, Feb. 5, 2007.
Lu et al., International Rectifier, Bridgeless PFC Implementation Using One Cycle Control Technique, 2005.
Linear Technology, LT1248, Power Factor Controller, Apr. 20, 2007.
On Semiconductor, AND8123/D, Power Factor Correction Stages Operating in Critical Conduction Mode, Sep. 2003.
On Semiconductor, MC33260, GreenLine Compact Power Factor Controller: Innovative Circuit for Cost Effective Solutions, Sep. 2005.
On Semiconductor, NCP1605, Enhanced, High Voltage and Efficient Standby Mode, Power Factor Controller, Feb. 2007.
On Semconductor, NCP1606, Cost Effective Power Factor Controller, Mar. 2007.
On Semiconductor, NCP1654, Product Review, Power Factor Controller for Compact and Robust, Continuous Conduction Mode Pre-Converters, Mar. 2007.
Philips, Application Note, 90W Resonant SMPS with TEA1610 SwingChip, AN99011, 1999.
NXP, TEA1750, GreenChip III SMPS control IC Product Data Sheet, Apr. 6, 2007.
Renesas, HA16174P/FP, Power Factor Correction Controller IC, Jan. 6, 2006.
Renesas Technology Releases Industry's First Critical-Conduction-Mode Power Factor Correction Control IC Implementing Interleaved Operation, Dec. 18, 2006.
Renesas, Application Note R2A20111 EVB, PFC Control IC R2A20111 Evaluation Board, Feb. 2007.
Stmicroelectronics, L6563, Advanced Transition-Mode PFC Controller, Mar. 2007.
Texas Instruments, Application Note SLUA321, Startup Current Transient of the Leading Edge Triggered PFC Controllers, Jul. 2004.
Texas Instruments, Application Report, SLUA309A, Avoiding Audible Noise at Light Loads when using Leading Edge Triggered PFC Converters, Sep. 2004.
Texas Instruments, Application Report SLUA369B, 350-W, Two-Phase Interleaved PFC Pre-Regulator Design Review, Mar. 2007.
Unitrode, High Power-Factor Preregulator, Oct. 1994.
Texas Instruments, Transition Mode PFC Controller, SLUS515D, Jul. 2005.
Unitrode Products From Texas Instruments, Programmable Output Power Factor Preregulator, Dec. 2004.
Unitrode Products From Texas Instruments, High Performance Power Factor Preregulator, Oct. 2005.
Texas Instruments, UCC3817 BiCMOS Power Factor Preregulator Evaluation Board User's Guide, Nov. 2002.
Unitrode, L. Balogh, Design Note UC3854A/B and UC3855A/B Provide Power Limiting with Sinusoidal Input Current for PFC Front Ends, SLUA196A, Nov. 2001.
A. Silva De Morais et al., A High Power Factor Ballast Using a Single Switch with Both Power Stages Integrated, IEEE Transactions on Power Electronics, vol. 21, No. 2, Mar. 2006.
M. Ponce et al., High-Efficient Integrated Electronic Ballast for Compact Fluorescent Lamps, IEEE Transactions on Power Electronics, vol. 21, No. 2, Mar. 2006.
A. R. Seidel et al., A Practical Comparison Among High-Power-Factor Electronic Ballasts with Similar Ideas, IEEE Transactions on Industry Applications, vol. 41, No. 6, Nov.-Dec. 2005.
F. T. Wakabayashi et al., An Improved Design Procedure for LCC Resonant Filter of Dimmable Electronic Ballasts for Fluorescent Lamps, Based on Lamp Model, IEEE Transactions on Power Electronics, vol. 20, No. 2, Sep. 2005.
J. A. Vilela Jr. et al., An Electronic Ballast with High Power Factor and Low Voltage Stress, IEEE Transactions on Industry Applications, vol. 41, No. 4, Jul./Aug. 2005.
S. T.S. Lee et al., Use of Saturable Inductor to Improve the Dimming Characteristics of Frequency-Controlled Dimmable Electronic Ballasts, IEEE Transactions on Power Electronics, vol. 19, No. 6, Nov. 2004.
M. K. Kazimierczuk et al., Electronic Ballast for Fluorescent Lamps, IEEETransactions on Power Electronics, vol. 8, No. 4, Oct. 1993.
S. Ben-Yaakov et al., Statics and Dynamics of Fluorescent Lamps Operating at High Frequency: Modeling and Simulation, IEEE Transactions on Industry Applications, vol. 38, No. 6, Nov.-Dec. 2002.
H. L. Cheng et al., A Novel Single-Stage High-Power-Factor Electronic Ballast with Symmetrical Topology, IEEE Transactions on Power Electronics, vol. 50, No. 4, Aug. 2003.
J.W.F. Dorleijn et al., Standardisation of the Static Resistances of Fluorescent Lamp Cathodes and New Data for Preheating, Industry Applications Conference, vol. 1, Oct. 13, 2002-Oct. 18, 2002.
Q. Li et al., An Analysis of the ZVS Two-Inductor Boost Converter under Variable Frequency Operation, IEEE Transactions on Power Electronics, vol. 22, No. 1, Jan. 2007.
H. Peng et al., Modeling of Quantization Effects in Digitally Controlled DC-DC Converters, IEEE Transactions on Power Electronics, vol. 22, No. 1, Jan. 2007.
G.Yao et al., Soft Switching Circuit for Interleaved Boost Converters, IEEE Transactions on Power Electronics, vol. 22, No. 1, Jan. 2007.
C. M. De Oliviera Stein et al., A ZCT Auxiliary Communication Circuit for Interleaved Boost Converters Operating in Critical Conduction Mode, IEEE Transactions on Power Electronics, vol. 17, No. 6, Nov. 2002.
W. Zhang et al., A New Duty Cycle Control Strategy for Power Factor Correction and FPGA Implementation, IEEE Transactions on Power Electronics, vol. 21, No. 6, Nov. 2006.
H. Wu et al., Single Phase Three-Level Power Factor Correction Circuit with Passive Lossless Snubber, IEEE Transactions on Power Electronics, vol. 17, No. 2, Mar. 2006.
O. Garcia et al., High Efficiency PFC Converter to Meet EN61000-3-2 and A14, Proceedings of the 2002 IEEE International Symposium on Industrial Electronics, vol. 3, 2002.

P. Lee et al., Steady-State Analysis of an Interleaved Boost Converter with Coupled Inductors, IEEE Transactions on Industrial Electronics, vol. 47, No. 4, Aug. 2000.

D.K.W. Cheng et al., A New Improved Boost Converter with Ripple Free Input Current Using Coupled Inductors, Power Electronics and Variable Speed Drives, Sep. 21-23, 1998.

B.A. Miwa et al., High Efficiency Power Factor Correction Using Interleaved Techniques, Applied Power Electronics Conference and Exposition, Seventh Annual Conference Proceedings, Feb. 23-27, 1992.

Z. Lai et al., A Family of Power-Factor-Correction Controllers, Twelfth Annual Applied Power Electronics Conference and Exposition, vol. 1, Feb. 23, 1997-Feb. 27, 1997.

L. Balogh et al., Power-Factor Correction with Interleaved Boost Converters in Continuous-Inductor-Current Mode, Eighth Annual Applied Power Electronics Conference and Exposition, 1993. APEC '93. Conference Proceedings, Mar. 7, 1993-Mar. 11, 1993.

Fairchild Semiconductor, Application Note 42030, Theory and Application of the ML4821 Average Current Mode PFC Controller, Oct. 25, 2000.

Unitrode Products From Texas Instruments, BiCMOS Power Factor Preregulator, Feb. 2006.

Power Integrations, Inc., "TOP200-4/14 TOPSwitch Family Three-terminal Off-line PWM Switch", XP-002524650, Jul. 1996, Sunnyvale, California.

Texas Instruments, SLOS318F, "High-Speed, Low Noise, Fully-Differential I/O Amplifiers," THS4130 and THS4131, US, Jan. 2006.

International Search Report and Written Opinion, PCT US20080062387, dated Feb. 5, 2008.

International Search Report and Written Opinion, PCT US200900032358, dated Jan. 29, 2009.

Hirota, Atsushi et al, "Analysis of Single Switch Delta-Sigma Modulated Pulse Space Modulation PFC Converter Effectively Using Switching Power Device," IEEE, US, 2002.

Prodic, Aleksandar, "Digital Controller for High-Frequency Rectifiers with Power Factor Correction Suitable for On-Chip Implementation," IEEE, US, 2007.

International Search Report and Written Opinion, PCT US20080062378, dated Feb. 5, 2008.

International Search Report and Written Opinion, PCT US20090032351, dated Jan. 29, 2009.

Erickson, Robert W. et al, "Fundamentals of Power Electronics," Second Edition, Chapter 6, Boulder, CO, 2001.

Allegro Microsystems, A1442, "Low Voltage Full Bridge Brushless DC Motor Driver with Hall Commutation and Soft-Switching, and Reverse Battery, Short Circuit, and Thermal Shutdown Protection," Worcester MA, 2009.

Texas Instruments, SLUS828B, "8-Pin Continuous Conduction Mode (CCM) PFC Controller", UCC28019A, US, revised Apr. 2009.

Analog Devices, "120 kHz Bandwidth, Low Distortion, Isolation Amplifier", AD215, Norwood, MA, 1996.

Burr-Brown, ISO120 and ISO121, "Precision Los Cost Isolation Amplifier," Tucson AZ, Mar. 1992.

Burr-Brown, ISO130, "High IMR, Low Cost Isolation Amplifier," SBOS220, US, Oct. 2001.

International Search Report and Written Report PCT US20080062428 dated Feb. 5, 2008.

Prodic, A. et al, "Dead Zone Digital Controller for Improved Dynamic Response of Power Factor Preregulators," IEEE, 2003.

Linear Technology, "Single Switch PWM Controller with Auxiliary Boost Converter," LT1950 Datasheet, Linear Technology, Inc. Milpitas, CA, 2003.

Yu, Zhenyu, 3.3V DSP for Digital Motor Control, Texas Instruments, Application Report SPRA550 dated Jun. 1999.

International Rectifier, Data Sheet No. PD60143-O, Current Sensing Single Channel Driver, El Segundo, CA, dated Sep. 8, 2004.

ST Datasheet L6562, Transition-Mode PFC Controller, 2005, STMicroelectronics, Geneva, Switzerland.

Maksimovic, Regan Zane and Robert Erickson, Impact of Digital Control in Power Electronics, Proceedings of 2004 International Symposium on Power Semiconductor Devices & Ics, Kitakyushu Apr. 5, 2010, Colorado Power Electronics Center, ECE Department, University of Colorado, Boulder, CO.

Texas Instrumetns, Interleaving Continuous Conduction Mode PFC Controller, UCC28070, SLUS794C, Nov. 2007, revised Jun. 2009, Texas Instruments, Dallas TX.

D. Hausman, Lutron, RTISS-TE Operation, Real-Time Illumination Stability Systems for Trailing-Edge (Reverse Phase Control) Dimmers, v. 1.0 Dec. 2004.

International Rectifier, Data Sheet No. PD60230 revC, IR1150(S)(PbF), uPFC One Cycle Control PFC IC Feb. 5, 2007.

Texas Instruments, Application Report SLUA308, UCC3817 Current Sense Transformer Evaluation, Feb. 2004.

Texas Instruments, Application Report SPRA902A, Average Current Mode Controlled Power Factor Correctiom Converter using TMS320LF2407A, Jul. 2005.

Unitrode, Design Note DN-39E, Optimizing Performance in UC3854 Power Factor Correction Applications, Nov. 1994.

Fairchild Semiconductor, Application Note 42030, Theory and Application of the ML4821 Average Currrent Mode PFC Controller, Aug. 1997.

Fairchild Semiconductor, Application Note AN4121, Design of Power Factor Correction Circuit Using FAN7527B, Rev.1.0.1, May 30, 2002.

Fairchild Semiconductor, Application Note 6004, 500W Power-Factor-Corrected (PFC) Converter Design with FAN4810, Rev. 1.0.1, Oct. 31, 2003.

Fairchild Semiconductor, FAN4822, ZVA Average Current PFC Controller, Rev. 1.0.1 Aug. 10, 2001.

Fairchild Semiconductor, ML4821, Power Factor Controller, Rev. 1.0.2, Jun. 19, 2001.

Fairchild Semiconductor, ML4812, Power Factor Controller, Rev. 1.0.4, May 31, 2001.

Linear Technology, 100 Watt LED Driver, undated.

Fairchild Semiconductor, FAN7544, Simple Ballast Controller, Rev. 1.0.0, 2004.

Fairchild Semiconductor, FAN7532, Ballast Controller, Rev. 1.0.2, 2006.

Fairchild Semiconductor, FAN7711, Ballast Control IC, Rev. 1.0.2, 2007.

Fairchild Semiconductor, KA7541, Simple Ballast Controller, Rev. 1.0.3, 2001.

ST Microelectronics, L6574, CFL/TL Ballast Driver Preheat and Dimming, Sep. 2003.

ST Microelectronics, AN993, Application Note, Electronic Ballast with PFC Using L6574 and L6561, May 2004.

"HV9931 Unity Power Factor LED Lamp Driver, Initial Release" 2005, SUPERTEX Inc., Sunnyvale, CA USA.

"AN-H52 Application Note: "HV9931 Unity Power Factor LED Lamp Driver Mar. 7, 2007, SUPERTEX Inc., Sunnyvale, CA, USA.

Dustin Rand et al: "Issues, Models and Solutions for Triac Modulated Phase Dimming of LED Lamps" Power Electronics Specialists Conference, 2007. PESC 2007, IEEE, IEEE, P1, Jun. 1, 2007, pp. 1398-1404.

Spiazzi G et al: "Analysis of a High-Power-Factor Electronic Ballast for High Brightness Light Emitting Diodes" Power Electronics Specialists, 2005 IEEE 36TH Conference on Jun. 12, 2005, Piscatawa, NJ USA, IEEE, Jun. 12, 2005, pp. 1494-1499.

International Search Report PCT/US2008/062381 dated Feb. 5, 2008.

International Search Report PCT/US2008/056739 dated Dec. 3, 2008.

Writeen Opinion of the International Searching Authority PCT/US2008/062381 dated Feb. 5, 2008.

Ben-Yaakov et al, "The Dynamics of a PWM Boost Converter with Resistive Input" IEEE Transactions on Industrial Electronics, IEEE Service Center, Piscataway, NJ, USA, vol. 46, No. 3, Jun. 1, 1999.

International Search Report PCT/US2008/062398 dated Feb. 5, 2008.

Partial International Search PCT/US2008/062387 dated Feb. 5, 2008.

Noon, Jim "UC3855A/B High Performance Power Factor Preregulator", Texas Instruments, SLUA146A, May, 1996, Revised Apr. 2004.

"High Performance Power Factor Preregulator", Unitrode Products from Texas Instruments, SLUS382B, Jun. 1998, Revised Oct. 2005.

International Search Report PCT/GB2006/003259 dated Jan. 12, 2007.
Written Opinion of the International Searching Authority PCT/US2008/056739.
International Search Report PCT/US2008/056606 dated Dec. 3, 2008.
Written Opinion of the International Searching Authority PCT/US2008/056606 dated Dec. 3, 2008.
International Search Report PCT/US2008/056608 dated Dec. 3, 2008.
Written Opinion of the International Searching Authority PCT/US2008/056608 dated Dec. 3, 2008.
International Search Report PCT/GB2005/050228 dated Mar. 14, 2006.
International Search PCT/US2008/062387 dated Jan. 10, 2008.
Data Sheet LT3496 Triple Output Led Driver, 2007, Linear Technology Corporation, Milpitas, CA.
News Release, Triple Output LED, LT3496.
Freescale Semiconductor, Inc., Dimmable Light Ballast with Power Factor Correction, Design Reference Manual, DRM067, Rev. 1, Dec. 2005.
J. Zhou et al., Novel Sampling Algorithm for DSP Controlled 2 kW PFC Converter, IEEE Transactions on Power Electronics, vol. 16, No. 2, Mar. 2001.
A. Prodic, Compensator Design and Stability Assessment for Fast Voltage Loops of Power Factor Correction Rectifiers, IEEE Transactions on Power Electronics, vol. 22, No. 5, Sep. 2007.
M. Brkovic et al., "Automatic Current Shaper with Fast Output Regulation and Soft-Switching," S.15.C Power Converters, Telecommunications Energy Conference, 1993.
Dallas Semiconductor, Maxim, "Charge-Pump and Step-Up DC-DC Converter Solutions for Powering White LEDs in Series or Parallel Connections," Apr. 23, 2002.
Freescale Semiconductor, AN3052, Implementing PFC Average Current Mode Control Using the MC9S12E128, Nov. 2005.
D. Maksimovic et al., "Switching Converters with Wide DC Conversion Range," Institute of Electrical and Electronic Engineer's (IEEE) Transactions on Power Electronics, Jan. 1991.
V. Nguyen et al., "Tracking Control of Buck Converter Using Sliding-Mode with Adaptive Hysteresis," Power Electronics Specialists Conference, 1995. PESC apos; 95 Record., 26th Annual IEEE vol. 2, Issue, Jun. 18-22, 1995 pp. 1086-1093.
S. Zhou et al., "A High Efficiency, Soft Switching DC-DC Converter with Adaptive Current-Ripple Control for Portable Applications," IEEE Transactions on Circuits and Systems—II: Express Briefs, vol. 53, No. 4, Apr. 2006.
K. Leung et al., "Use of State Trajectory Prediction in Hysteresis Control for Achieving Fast Transient Response of the Buck Converter," Circuits and Systems, 2003. ISCAS apos;03. Proceedings of the 2003 International Symposium, vol. 3, Issue, May 25-28, 2003 pp. III-439-III-442 vol. 3.
K. Leung et al., "Dynamic Hysteresis Band Control of the Buck Converter with Fast Transient Response," IEEE Transactions on Circuits and Systems—II: Express Briefs, vol. 52, No. 7, Jul. 2005.
Y. Ohno, Spectral Design Considerations for White LED Color Rendering, Final Manuscript, Optical Engineering, vol. 44, 111302 (2005).
S. Skogstad et al., A Proposed Stability Characterization and Verification Method for High-Order Single-Bit Delta-Sigma Modulators, Norchip Conference, Nov. 2006 http://folk.uio.no/savskogs/pub/A_Proposed_Stability_Characterization.pdf.
J. Turchi, Four Key Steps to Design a Continuous Conduction Mode PFC Stage Using the NCP1653, ON Semiconductor, Publication Order No. AND184/D, Nov. 2004.
Megaman, D or S Dimming ESL, Product News, Mar. 15, 2007.
J. Qian et al., New Charge Pump Power-Factor-Correction Electronic Ballast with a Wide Range of Line Input Voltage, IEEE Transactions on Power Electronics, vol. 14, No. 1, Jan. 1999.
P. Green, A Ballast that can be Dimmed from a Domestic (Phase-Cut) Dimmer, IRPLCFL3 rev. b, International Rectifier, http://www.irf.com/technical-info/refdesigns/cfl-3.pdf, printed Mar. 24, 2007.
J. Qian et al., Charge Pump Power-Factor-Correction Technologies Part II: Ballast Applications, IEEE Transactions on Power Electronics, vol. 15, No. 1, Jan. 2000.
Chromacity Shifts in High-Power White LED Systems due to Different Dimming Methods, Solid-State Lighting, http://www.lrc.rpi.edu/programs/solidstate/completedProjects.asp?ID=76, printed May 3, 2007.
S. Chan et al., Design and Implementation of Dimmable Electronic Ballast Based on Integrated Inductor, IEEE Transactions on Power Electronics, vol. 22, No. 1, Jan. 2007.
M. Madigan et al., Integrated High-Quality Rectifier-Regulators, IEEE Transactions on Industrial Electronics, vol. 46, No. 4, Aug. 1999.
T. Wu et al., Single-Stage Electronic Ballast with Dimming Feature and Unity Power Factor, IEEE Transactions on Power Electronics, vol. 13, No. 3, May 1998.
F. Tao et al., "Single-Stage Power-Factor-Correction Electronic Ballast with a Wide Continuous Dimming Control for Fluorescent Lamps," IEEE Power Electronics Specialists Conference, vol. 2, 2001.
Azoteq, IQS17 Family, IQ Switch®—ProxSense™ Series, Touch Sensor, Load Control and User Interface, IQS17 Datasheet V2.00. doc, Jan. 2007.
C. Dilouie, Introducing the LED Driver, EC&M, Sep. 2004.
S. Lee et al., Triac Dimmable Ballast with Power Equalization, IEEE Transactions on Power Electronics, vol. 20, No. 6, Nov. 2005.
L. Gonthier et al., EN55015 Compliant 500W Dimmer with Low-Losses Symmetrical Switches, 2005 European Conference on Power Electronics and Applications, Sep. 2005.
Why Different Dimming Ranges? The Difference Between Measured and Perceived Light, http://www.lutron.com/ballast/pdf/LutronBallastpg3.pdf.
D. Hausman, Real-Time Illumination Stability Systems for Trailing-Edge (Reverse Phase Control) Dimmers, Technical White Paper, Lutron, version 1.0, Dec. 2004, http://www.lutron.com/technical_info/pdf/RTISS-TE.pdf.
Light Dimmer Circuits, www.epanorama.net/documents/lights/lightdimmer.html, printed Mar. 26, 2007.
Light Emitting Diode, http://en.wikipedia.org/wiki/Light-emitting_diode, printed Mar. 27, 2007.
Color Temperature, www.sizes.com/units/color_temperature.htm, printed Mar. 27, 2007.
S. Lee et al., A Novel Electrode Power Profiler for Dimmable Ballasts Using DC Link Voltage and Switching Frequency Controls, IEEE Transactions on Power Electronics, vol. 19, No. 3, May 2004.
Y. Ji et al., Compatibility Testing of Fluorescent Lamp and Ballast Systems, IEEE Transactions on Industry Applications, vol. 35, No. 6, Nov./Dec. 1999.
National Lighting Product Information Program, Specifier Reports, "Dimming Electronic Ballasts," vol. 7, No. 3, Oct. 1999.
Supertex Inc., Buck-based LED Drivers Using the HV9910B, Application Note AN-H48, Dec. 28, 2007.
D. Rand et al., Issues, Models and Solutions for Triac Modulated Phase Dimming of LED Lamps, Power Electronics Specialists Conference, 2007.
Supertex Inc., HV9931 Unity Power Factor LED Lamp Driver, Application Note AN-H52, Mar. 7, 2007.
Supertex Inc., 56W Off-line LED Driver, 120VAC with PFC, 160v, 350mA Load, Dimmer Switch Compatible, DN-H05, Feb. 2007.
ST Microelectronics, Power Factor Corrector L6561, Jun. 2004.
Fairchild Semiconductor, Application Note 42047 Power Factor Correction (PFC) Basics, Rev. 0.9.0 Aug. 19, 2004.
M. Radecker et al., Application of Single-Transistor Smart-Power IC for Fluorescent Lamp Ballast, Thirty-Fourth Annual Industry Applications Conference IEEE, vol. 1, Oct. 3, 1999-Oct. 7, 1999.
M. Rico-Secades et al., Low Cost Electronic Ballast for a 36-W Fluorescent Lamp Based on a Current-Mode-Controlled Boost Inverter for a 120-V DC Bus Power Distribution, IEEE Transactions on Power Electronics, vol. 21, No. 4, Jul. 2006.

Fairchild Semiconductor, FAN4800, Low Start-up Current PFC/PWM Controller Combos, Nov. 2006.

Fairchild Semiconductor, FAN4810, Power Factor Correction Controller, Sep. 24, 2003.

Fairchild Semiconductor, FAN4822, ZVS Average Current PFC Controller, Aug. 10, 2001.

Fairchild Semiconductor, FAN7527B, Power Factor Correction Controller, 2003.

Fairchild Semiconductor, ML4821, Power Factor Controller, Jun. 19, 2001.

Freescale Semiconductor, AN1965, Design of Indirect Power Factor Correction Using 56F800/E, Jul. 2005.

International Search Report for PCT/US2008/051072, mailed Jun. 4, 2008.

POWER FACTOR CORRECTION CONTROLLER WITH SWITCH NODE FEEDBACK

CROSS-REFERENCE TO RELATED APPLICATION

This application claims the benefit under 35 U.S.C. §119 (e) and 37 C.F.R. §1.78 of U.S. Provisional Application No. 60/915,547, filed May 2, 2007, and entitled "Power Factor Correction (PFC) Controller Apparatuses and Methods," and is incorporated by reference in its entirety.

BACKGROUND OF THE INVENTION

1. Field of the Invention

The present invention relates in general to the field of signal processing, and more specifically to switching power converters and a power factor correction controller with switch node feedback.

2. Description of the Related Art

Power control systems provide power factor corrected and regulated output voltages to many applications that utilize a regulated output voltage. FIG. 1 depicts a power control system 100, which includes a switching power converter 102. The switching power converter 102 performs power factor correction and provides constant voltage power to load 112. Voltage source 101 supplies an alternating current (AC) input voltage $V_{in}(t)$ to a full, diode bridge rectifier 103. The voltage source 101 is, for example, a public utility, and the AC voltage $V_{in}(t)$ is, for example, a 60 Hz/110 V line voltage in the United States or a 50 Hz/220 V line voltage in Europe. The rectifier 103 rectifies the input voltage $V_{in}(t)$ and supplies a rectified, time-varying, line input voltage $V_x(t)$ to the switching power converter.

The switching power converter 102 includes power factor correction (PFC) stage 124 and driver stage 126. The PFC stage 124 is controlled by switch 108 and provides power factor correction. The driver stage 126 is also controlled by switch 108 and regulates the transfer of energy from the line input voltage $V_x(t)$ through inductor 110 to capacitor 106. The inductor current $i_L$ ramps 'up' when the switch 108 conducts, i.e. is "ON". The inductor current $i_L$ ramps down when switch 108 is nonconductive, i.e. is "OFF", and supplies current $i_L$ to recharge capacitor 106. The time period during which inductor current $i_L$ ramps down is commonly referred to as the "inductor flyback time". In at least one embodiment, the switching power converter 102 operates in discontinuous current mode, i.e. the inductor current $i_L$ ramp up time plus the inductor flyback time is less than the period of switch 108.

Capacitor 106 supplies stored energy to load 112 while the switch 108 conducts. The capacitor 106 is sufficiently large so as to maintain a substantially constant output voltage $V_c(t)$, as established by a power factor correction (PFC) and output voltage controller 114 (as discussed in more detail below). The output voltage $V_c(t)$ remains substantially constant during constant load conditions. However, as load conditions change, the output voltage $V_c(t)$ changes. The PFC and output voltage controller 114 responds to the changes in $V_c(t)$ and adjusts the control signal $CS_0$ to maintain a substantially constant output voltage as quickly as possible. The output voltage controller 114 includes a small capacitor 115 to filter any high frequency signals from the line input voltage $V_x(t)$.

The power control system 100 also includes a PFC and output voltage controller 114 to control the switch 108 and, thus, control power factor correction and regulate output power of the switching power converter 102. The goal of power factor correction technology is to make the switching power converter 102 appear resistive to the voltage source 101. Thus, the PFC and output voltage controller 114 attempts to control the inductor current $i_L$ so that the average inductor current $i_L$ is linearly and directly related to the line input voltage $V_x(t)$. Prodić, *Compensator Design and Stability Assessment for Fast Voltage Loops of Power Factor Correction Rectifiers*, IEEE Transactions on Power Electronics, Vol. 22, No. 5, September 2007, pp. 1719-1729 (referred to herein as "Prodić"), describes an example of PFC and output voltage controller 114. The PFC and output voltage controller 114 supplies a pulse width modified (PWM) control signal $CS_0$ to control the conductivity of switch 108. In at least one embodiment, switch 108 is a field effect transistor (FET), and control signal $CS_0$ is the gate voltage of switch 108. The values of the pulse width and duty cycle of control signal $CS_o$ depend on two feedback signals, namely, the line input voltage $V_x(t)$ and the capacitor voltage/output voltage $V_c(t)$.

Switching power converter 114 receives two feedback signals, the line input voltage $V_x(t)$ and the output voltage $V_c(t)$, via a wide bandwidth current loop 116 and a slower voltage loop 118. The line input voltage $V_x(t)$ is sensed from node 120 between the diode rectifier and inductor 110. The output voltage $V_c(t)$ is sensed from node 122 between diode 111 and load 112. The current loop 116 operates at a frequency $f_c$ that is sufficient to allow the PFC and output controller 114 to respond to changes in the line input voltage $V_x(t)$ and cause the inductor current $i_L$ to track the line input voltage to provide power factor correction. The current loop frequency is generally set to a value between 20 kHz and 150 kHz. The voltage loop 118 operates at a much slower frequency $f_v$, typically 10-20 Hz. The capacitor voltage $V_c(t)$ includes a ripple component having a frequency equal to twice the frequency of input voltage $V_{in}(t)$, e.g. 120 Hz. Thus, by operating at 10-20 Hz, the voltage loop 118 functions as a low pass filter to filter the ripple component.

SUMMARY OF THE INVENTION

In one embodiment of the present invention, a power factor correction (PFC) controller is configured to control power factor correction of a switching power converter. The switching power converter includes an inductor and a switch coupled to a switch node. The PFC controller includes a first input terminal, coupled to the switch node, to receive a feedback signal from the switch node. The PFC controller is configured to determine from the feedback signal at least one of (i) the line input voltage and (ii) an output voltage of the switching power converter and determine at least one of (i) the line input voltage and (ii) the output voltage of the switching power converter. The PFC controller is further configured to provide a control signal to the switch to control power factor correction of the switching power converter in response to the determined line input voltage and the determined output voltage of the switching power converter.

In another embodiment of the present invention, a power factor correction (PFC) controller is configured to control power factor correction and regulate output voltage of a switching power converter. The PFC controller includes an input to receive a feedback signal from the switching power converter. The PFC controller is configured to determine a line input voltage and an output voltage of the switching power converter from the feedback signal. The PFC controller is further configured to provide a control signal to the switching power converter to control power factor correction and regulate output voltage of the switching power converter in response to the determined line input voltage and the determined output voltage of the switching power converter.

In a further embodiment of the present invention, a method of control power factor correction of a switching power converter, wherein the switching power converter includes an inductor and a switch coupled to a switch node, includes receiving a feedback signal from the switch node. The method further includes determining from the feedback signal at least one of (i) the line input voltage and (ii) an output voltage of the switching power converter and determining at least one of (i) the line input voltage and (ii) the output voltage of the switching power converter. The method also includes providing a control signal to the switch to control power factor correction of the switching power converter in response to the determined line input voltage and the determined output voltage of the switching power converter.

In another embodiment of the present invention, an apparatus to control power factor correction of a switching power converter, wherein the switching power converter includes an inductor and a switch coupled to a switch node. The apparatus includes means for receiving a feedback signal from the switch node. The apparatus also includes means for determining from the feedback signal at least one of (i) the line input voltage and (ii) an output voltage of the switching power converter and means for determining at least one of (i) the line input voltage and (ii) the output voltage of the switching power converter. The apparatus further includes means for providing a control signal to the switch to control power factor correction of the switching power converter in response to the determined line input voltage and the determined output voltage of the switching power converter.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A power control system includes a switching power converter and a power factor correction (PFC) and output voltage controller. The switching power converter includes an inductor to supply charge to an output capacitor and a switch to control inductor current ramp-up times and energy transfer to the output capacitor. In at least one embodiment, the PFC and output voltage controller provides a control signal to the switch to control power factor correction and regulate output voltage of the switching power converter. In at least one embodiment, during a single period of the control signal, the PFC and output voltage controller determines the line input voltage, the output voltage, or both using a single feedback signal received from the switching power converter. In at least one embodiment, the feedback signal is received from a switch node located between the inductor and the switch. In at least one embodiment, the PFC and output voltage controller determines either the line input voltage or the output voltage, whichever was not determined from the feedback signal, using a second feedback signal received from either a PFC stage or a driver stage of the switching power converter. Using the line input voltage and the output voltage, the PFC and output voltage controller generates the control signal to provide power factor correction and output voltage regulation.

Figure 1:
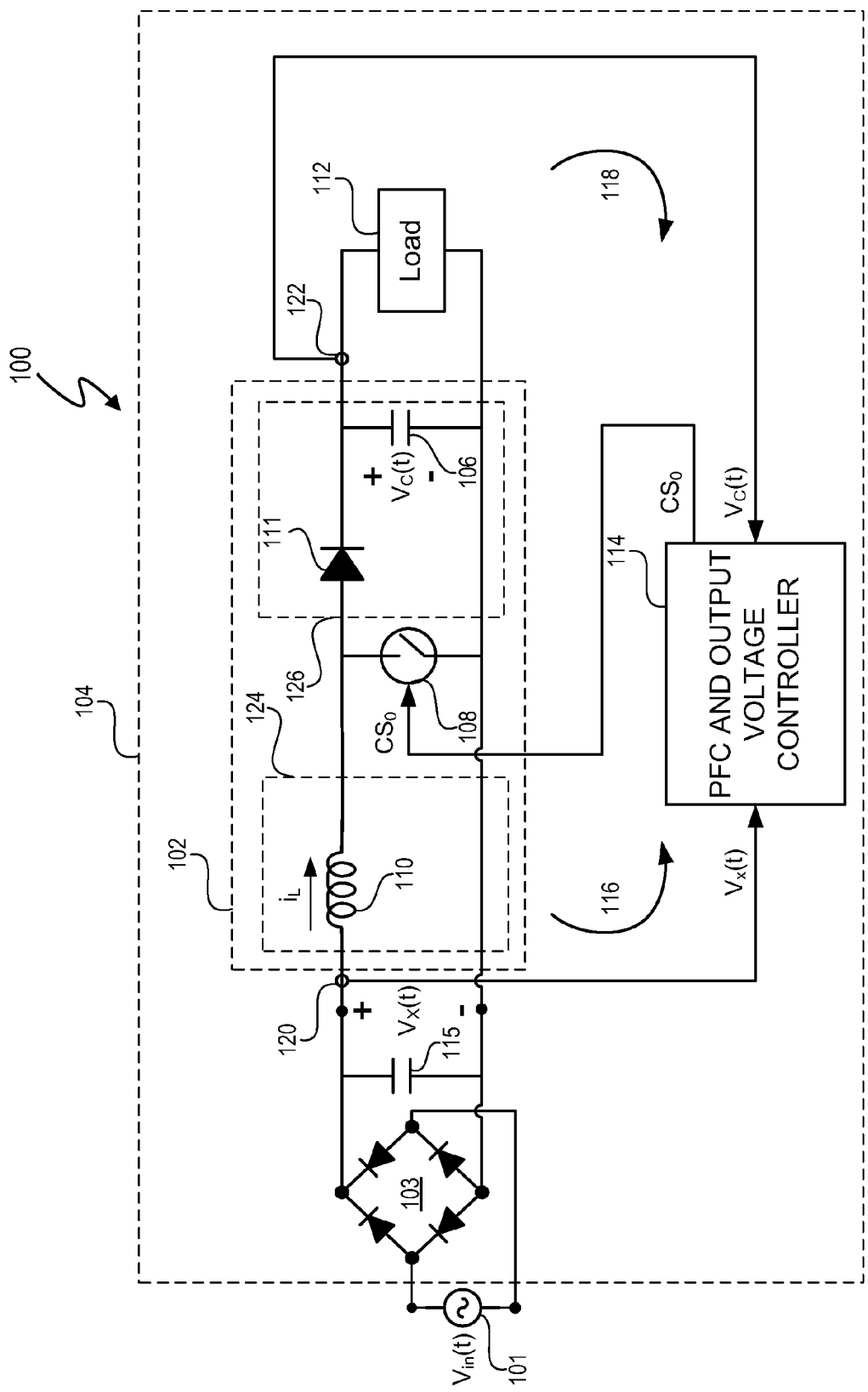
FIG. 1 (labeled prior art) depicts a power control system with power factor correction and output voltage regulation.
Figure 1A:
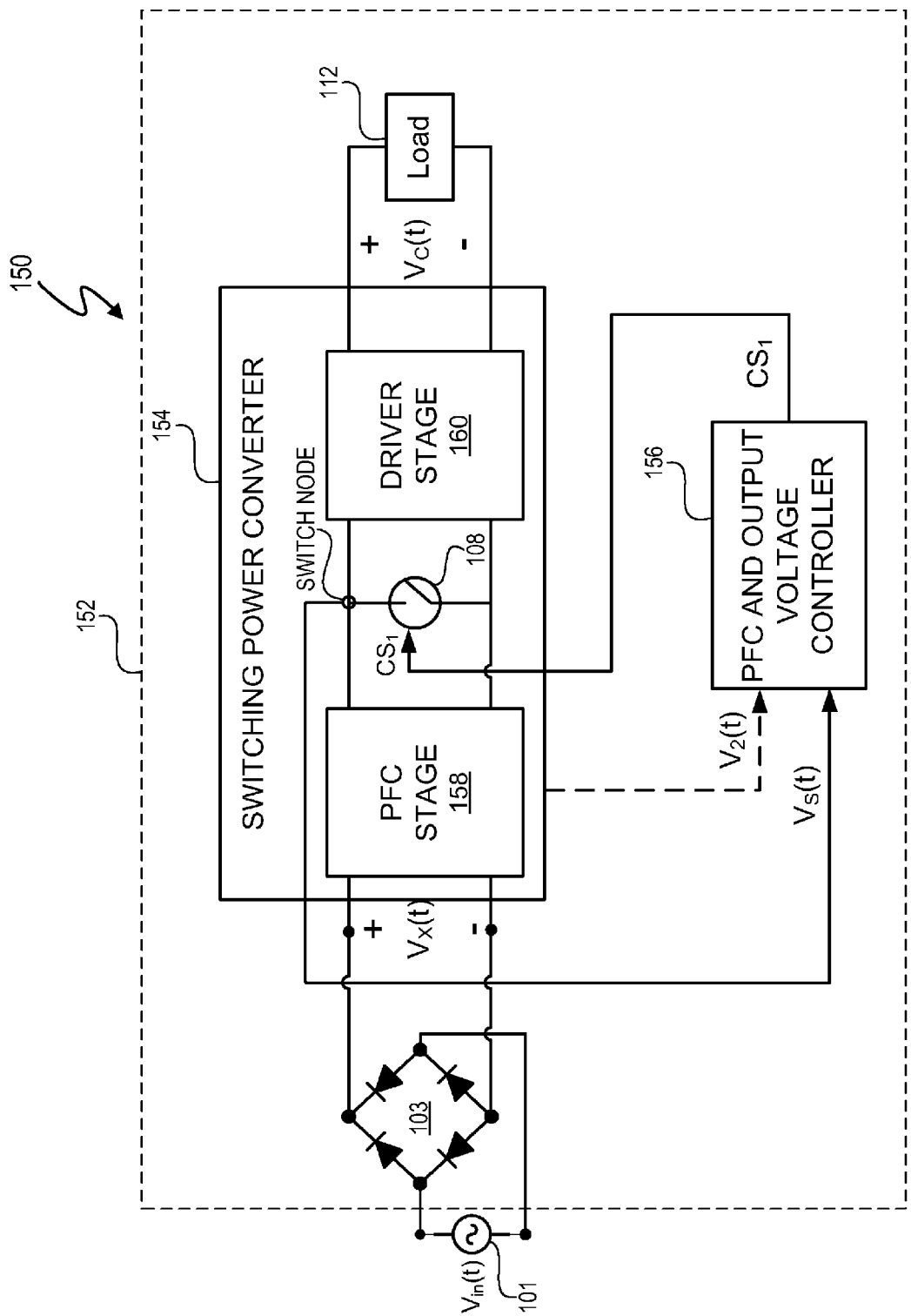
FIG. 1A depicts a power control system with a single feedback signal to determine a line input voltage and an output voltage.

FIG. 1A depicts one embodiment of a power control system 150. The power control system 150 includes a switching power converter 154. The switching power converter 154 includes a power factor correction stage 158 to provide power factor correction. The switching power converter 154 also includes a driver stage 160 to provide a regulated output voltage $V_c(t)$ to load 112. The PFC and output voltage controller 156 receives a feedback signal $V_S(t)$ from the SWITCH NODE and, in at least one embodiment, the PFC and output voltage controller 156 receives a second feedback signal $V_2(t)$ from either the PFC stage 158 or the driver stage 160. The PFC and output voltage controller 156 provides a control signal $CS_1$ to the switching power converter 154 to control switch 108, and, thus, control power factor correction and voltage regulation. To determine the control signal $CS_1$, the PFC and output voltage controller 156 receives feedback signal $V_S(t)$ from the switching power converter 154. In at least one embodiment, the PFC and output voltage controller 156 determines control signal $CS_1$ using the single feedback signal $V_S(t)$. In at least one embodiment, using feedback signal $V_S(t)$ and a second feedback signal $V_2(t)$, the power control system 150 can be implemented using digital and/or analog hardware or a combination of hardware and software. In at least one embodiment, PFC and output voltage controller 156 is a programmable PFC and output voltage controller as illustratively described in U.S. patent application Ser. No. 11/967,275 entitled "Programmable Power Control System", inventor John L. Melanson, assignee Cirrus Logic, Inc., which is incorporated herein by reference in its entirety.

FIGS. 2A, 2B, 2C, and 2D (generically referred to as FIG. 2) depict various embodiments of power control system 150.

Figure 2A:
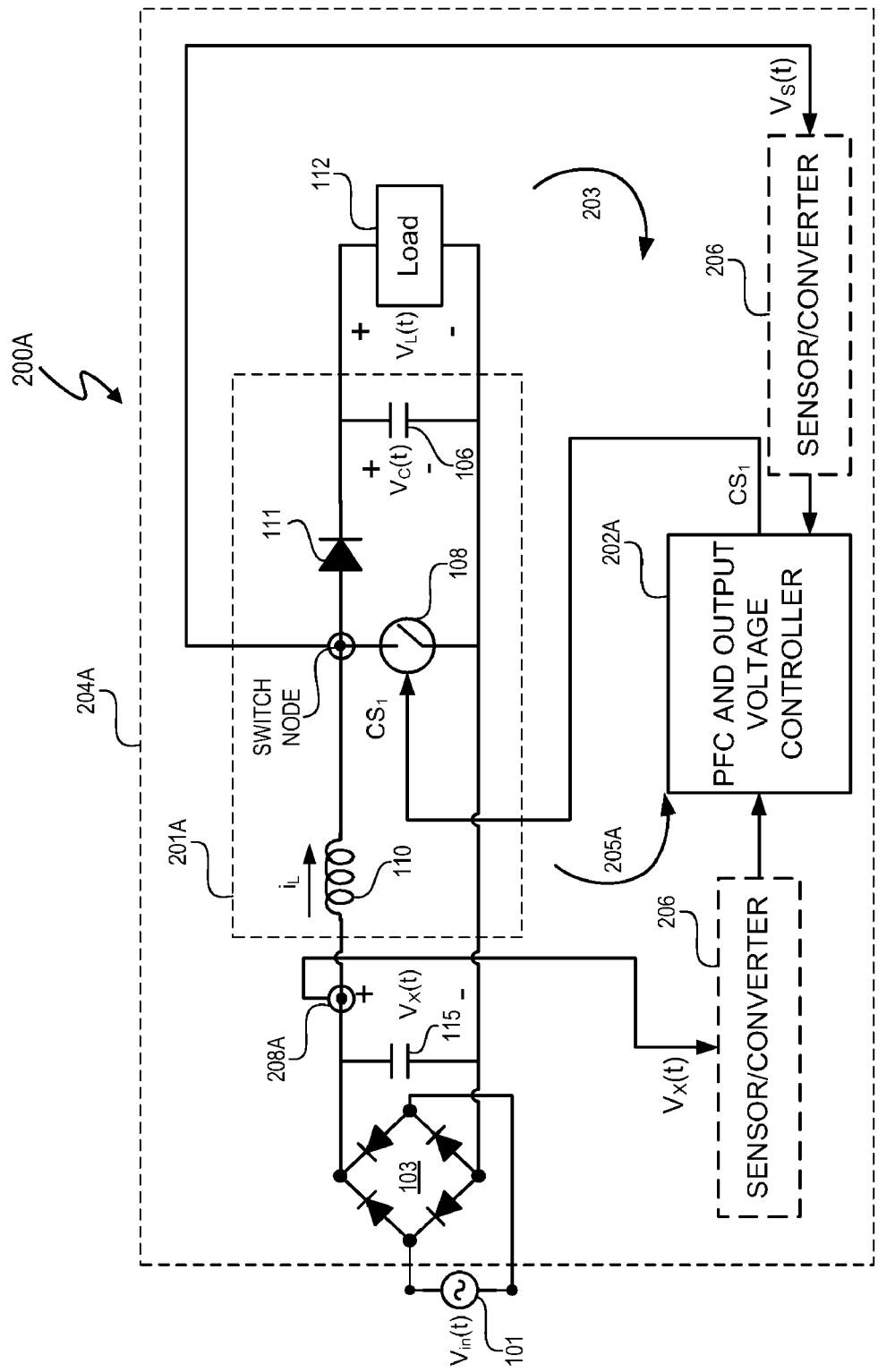
FIGS. 2A, 2B, 2C, and 2D depict respective embodiments of the power control system of FIG. 1A.

FIG. 2A depicts power control system 200A that includes PFC and output voltage controller 202A. The power control system 200A and PFC and output voltage controller 202A represent one embodiment of respective power control system 150 and PFC and output voltage controller 156. During operation, PFC and output voltage controller 202A receives feedback signal $V_S(t)$ from a SWITCH NODE of switching power converter 201A, and PFC and output voltage controller 202A determines the output voltage $V_c(t)$ using the feedback signal $V_S(t)$ and a second feedback signal, line input voltage $V_x(t)$. The switching power converter 201A provides a power factor corrected and regulated output voltage $V_c(t)$ to load 112. The output voltage $V_c(t)$ across output capacitor 106 equals the load voltage $V_L(t)$. The power control system 200A includes a feedback path 203 to provide the feedback signal $V_S(t)$ from the SWITCH NODE to PFC and output voltage controller 202A. The power control system 200A also includes a feedback path 205A to provide a second feedback signal, line input voltage $V_x(t)$, from node 208A to PFC and output voltage controller 202A. PFC and output voltage controller 202A determines the line input voltage $V_x(t)$, including an approximation or scaled version thereof, from the second feedback signal. In at least one embodiment, the feedback signals $V_S(t)$ and $V_x(t)$ received by PFC and output voltage controller 202A are voltages, currents, or any combination of voltages and currents. The PFC and output voltage controller 202A uses the determined line input voltage $V_x(t)$ and the output voltage $V_c(t)$ of switching power converter 201A to generate the control signal $CS_1$. In at least one embodiment, power control system 200A includes sensor/converter 206, which is discussed subsequently in more detail.

Figure 2B:
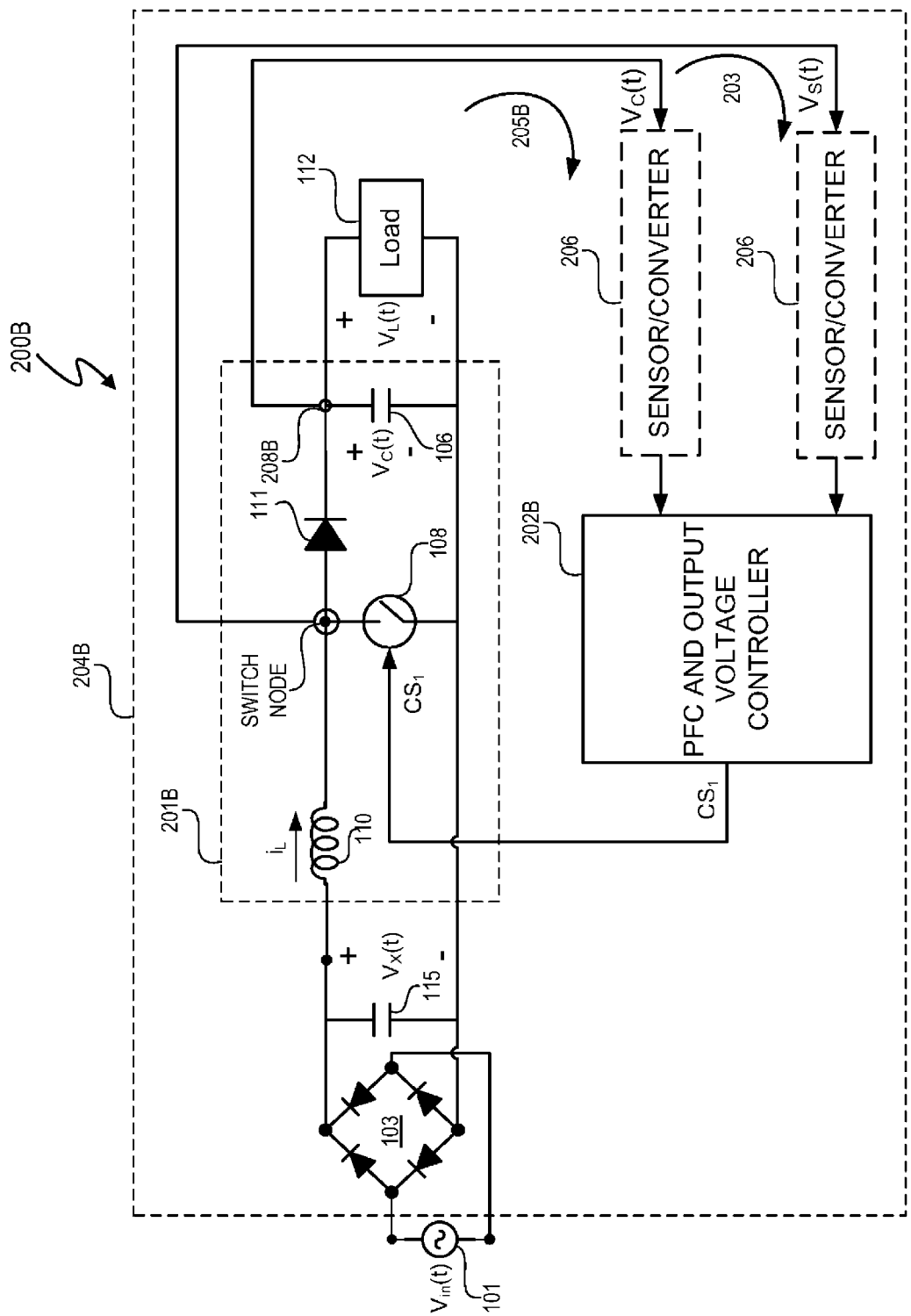

FIG. 2B depicts power control system 200B that includes PFC and output voltage controller 202B. The power control system 200B and PFC and output voltage controller 202B represent one embodiment of respective power control system 150 and PFC and output voltage controller 156. During operation, PFC and output voltage controller 202B receives feedback signal $V_S(t)$ from a SWITCH NODE of switching power converter 201B, and PFC and output voltage controller 202B determines the line input voltage $V_x(t)$ using the feedback signal $V_S(t)$ and a second feedback signal, output voltage $V_c(t)$. The switching power converter 201B provides a power factor corrected and regulated output voltage $V_c(t)$ to load 112. The output voltage $V_c(t)$ across output capacitor 106 equals the load voltage $V_L(t)$.

The power control system 200B includes a feedback path 203 to provide the feedback signal $V_S(t)$ from the SWITCH NODE to PFC and output voltage controller 202B. The power control system 200B also includes a feedback path 205B to provide a second feedback signal, the output voltage $V_c(t)$, from node 208B to PFC and output voltage controller 202B. PFC and output voltage controller 202B determines the output voltage $V_c(t)$, including an approximation or scaled version thereof. In at least one embodiment, the feedback signals $V_S(t)$ and $V_c(t)$ provided to PFC and output voltage controller 202B are voltages, currents, or any combination of voltages and currents.

The PFC and output voltage controller 202B determines the line input voltage $V_x(t)$ from the feedback signal $V_S(t)$. The PFC and output voltage controller 202B uses the determined line input voltage $V_x(t)$ and the output voltage $V_c(t)$ of switching power converter 201B to generate the control signal $CS_1$. In at least one embodiment, power control system 200B includes sensors/converters 206, which are discussed subsequently in more detail.

The output voltage $V_c(t)$ can be detected in any of a variety of ways including as described in the exemplary embodiments of U.S. patent application Ser. No. 11/967,276 entitled "Power Factor Correction Controller With Digital FIR Filter Output Voltage Sampling", inventor John L. Melanson, assignee Cirrus Logic, Inc., ("Melanson I") and U.S. patent application Ser. No. 11/967,277 entitled "Power Supply Dc Voltage Offset Detector", inventor John L. Melanson, assignee Cirrus Logic, Inc., ("Melanson II"). Melanson I and Melanson II are incorporated herein by reference in their entireties.

Figure 2C:
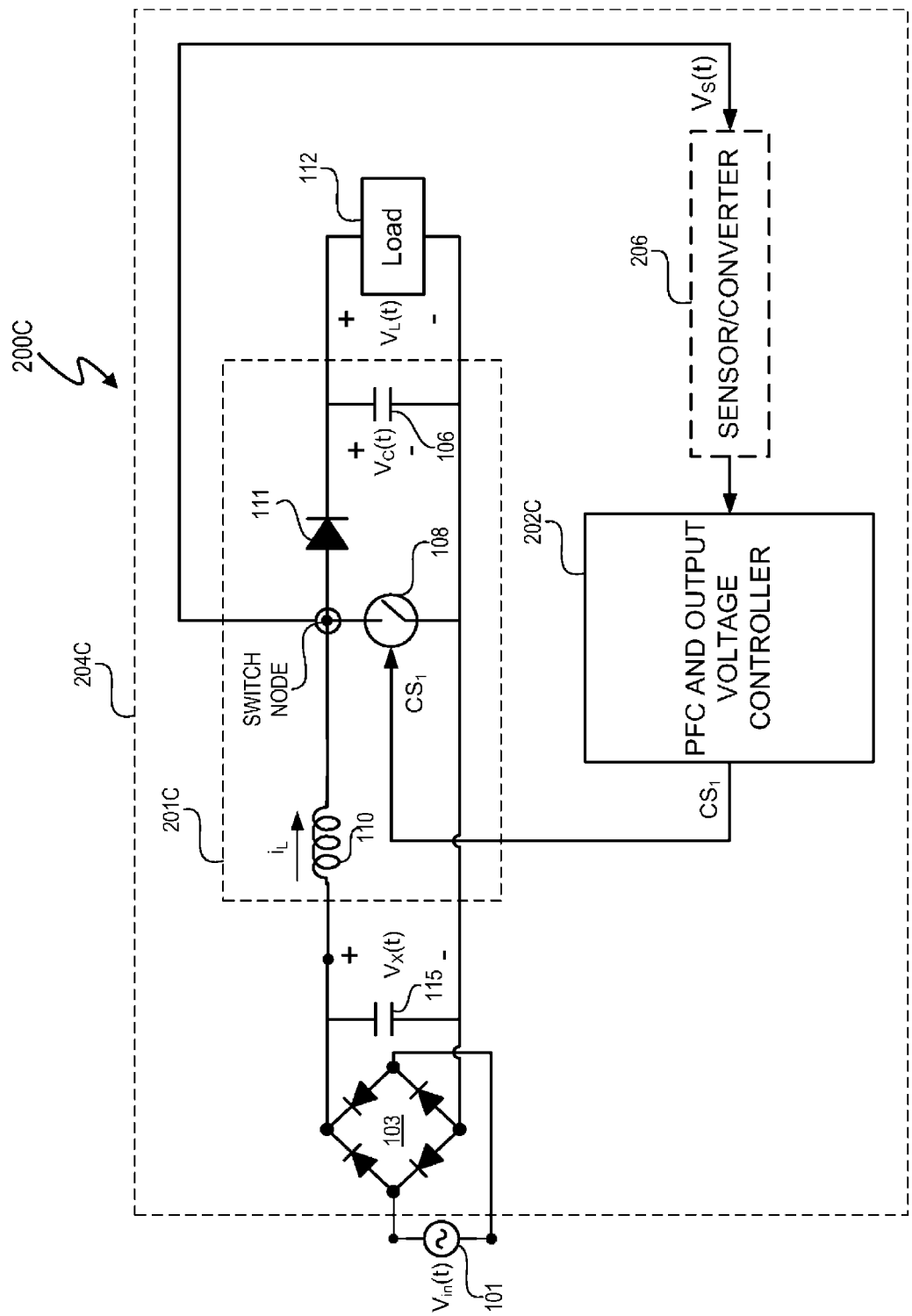

FIG. 2C depicts power control system 200C that includes PFC and output voltage controller 202C. The power control system 200C and PFC and output voltage controller 202C represent one embodiment of respective power control system 150 and PFC and output voltage controller 156. During operation, PFC and output voltage controller 202C receives feedback signal $V_S(t)$ from a SWITCH NODE of switching power converter 201C, and PFC and output voltage controller 202C determines the line input voltage $V_x(t)$ and the output voltage $V_c(t)$ using the feedback signal $V_S(t)$. The switching power converter 201C provides a power factor corrected and regulated output voltage $V_c(t)$ to load 112. The output voltage $V_c(t)$ across output capacitor 106 equals the load voltage $V_L(t)$. The power control system 200C includes a feedback path 203 to provide the feedback signal $V_S(t)$ from the SWITCH NODE to PFC and output voltage controller 202. In at least one embodiment, the feedback signal $V_S(t)$ provided to PFC and output voltage controller 202C is a voltage or current. The PFC and output voltage controller 202C determines the line input voltage $V_x(t)$ and the output voltage $V_c(t)$ from the single feedback signal $V_S(t)$. The PFC and output voltage controller 202C uses the determined line input voltage $V_x(t)$ and the output voltage $V_c(t)$ of switching power converter 201C to generate the control signal $CS_1$. In at least one embodiment, power control system 200C includes sensor/converter 206, which is discussed subsequently in more detail.

Figure 2D:
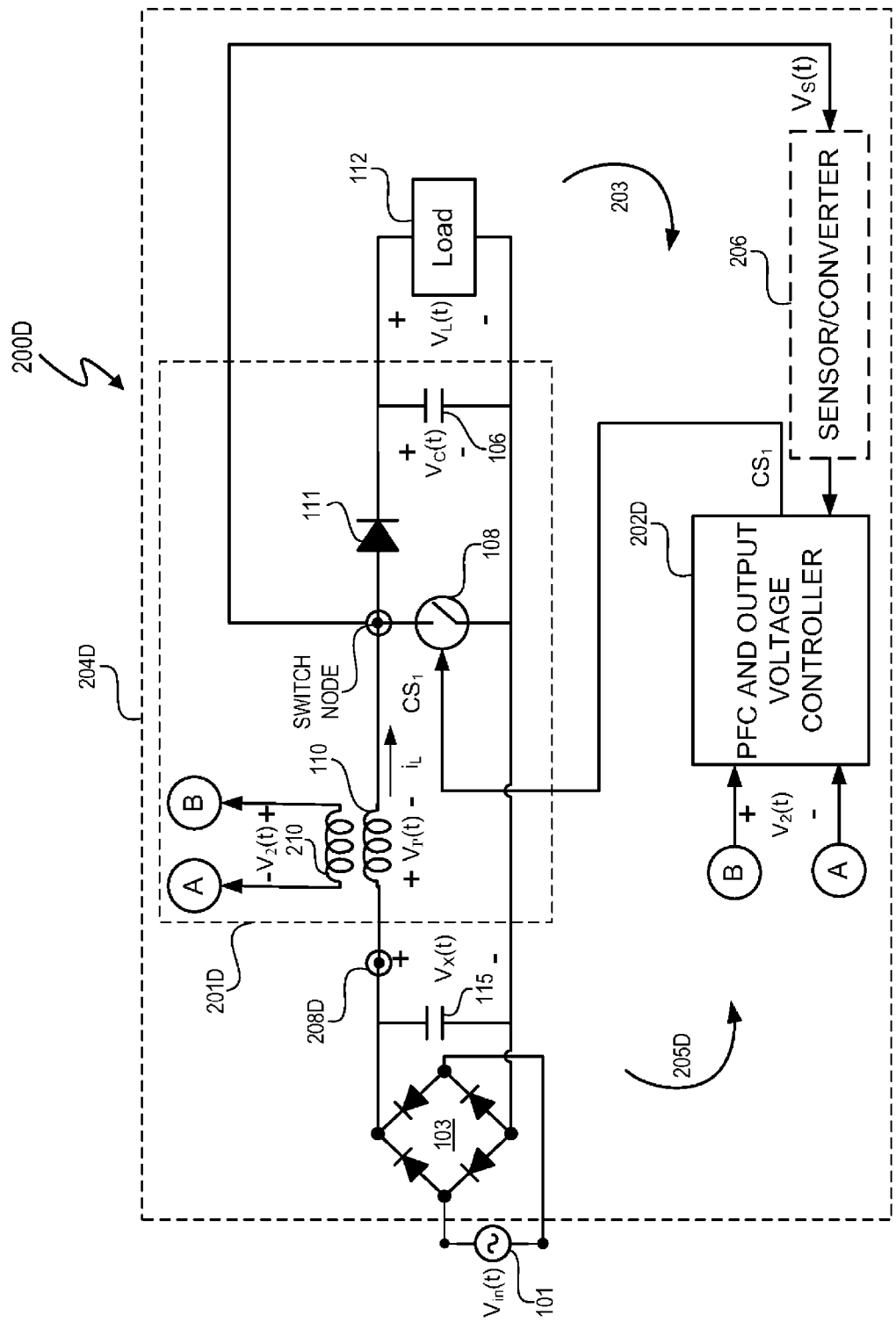

FIG. 2D depicts power control system 200D that includes PFC and output voltage controller 202D. The power control system 200D and PFC and output voltage controller 202D represent one embodiment of respective power control system 150 and PFC and output voltage controller 156. During operation, PFC and output voltage controller 202D receives feedback signal $V_S(t)$ from a SWITCH NODE of switching power converter 201D. The PFC and output voltage controller 202D also receives a second feedback signal $V_2(t)$, sensed across inductor 110. PFC and output voltage controller 202D determines the line input voltage $V_x(t)$ or the output voltage $V_c(t)$ using the feedback signal $V_S(t)$ and the second feedback signal $V_2(t)$. The switching power converter 201D provides a power factor corrected and regulated output voltage $V_c(t)$ to load 112. The output voltage $V_c(t)$ across output capacitor 106 equals the load voltage $V_L(t)$.

The power control system 200D includes a feedback path 203 to provide the feedback signal $V_S(t)$ from the SWITCH NODE to PFC and output voltage controller 202D. In at least one embodiment, the feedback signal $V_S(t)$ provided to PFC and output voltage controller 202D is a voltage or a current, both sensed at the SWITCH NODE. The PFC and output voltage controller 202D determines the line input voltage $V_x(t)$ or the output voltage $V_c(t)$ from feedback signal $V_S(t)$. The PFC and output voltage controller 202D uses the determined line input voltage $V_x(t)$ and the output voltage $V_c(t)$ of switching power converter 201D to generate the control signal $CS_1$.

In at least one embodiment, the PFC and output voltage controller 202D determines the line input voltage $V_x(t)$ from the feedback signal $V_S(t)$ if the PFC and output voltage controller 202D determines the output voltage $V_c(t)$ from the second feedback signal $V_2(t)$. The PFC and output voltage controller 202D determines the output voltage $V_c(t)$ from the feedback signal $V_S(t)$ if the PFC and output voltage controller 202D determines the line input voltage $V_x(t)$ from the second feedback signal $V_2(t)$. In at least one embodiment, power control system 200D includes sensor/converter 206, which is discussed subsequently in more detail.

The switching power converter 201D includes a secondary winding 210 magnetically coupled to inductor 110. The inductor 110 represents a primary winding, and the inductor voltage $V_P(t)$ is directly proportional to the inductor current $i_L$. In at least one embodiment, the PFC and output voltage controller 202D includes two terminals to receive the feedback signal $V_2(t)$ generated by the secondary winding 210.

Inductor 110 induces the secondary feedback signal voltage $V_2(t)$ in the secondary winding 210 that is directly proportional to the inverse of the inductor voltage $V_P(t)$. The feedback signal $V_2(t)$ relates to the inductor voltage in accordance with Equation [1]:

$$V_P(t) = -V_S(t) \cdot \frac{n_S}{n_P} = -V_S(t) \cdot k. \quad \text{Equation [1]}$$

"$n_S$" is the number of windings in the second winding 210, "$n_P$" is the number of windings in the inductor 110, and $k=n_S/n_P$. The value of "$n_P$" is set by the choice of inductor 110. The value of "$n_S$" can be set so that PFC and output voltage controller 202D can receive feedback signal $V_S(t)$ directly without any conversion.

Figure 3:
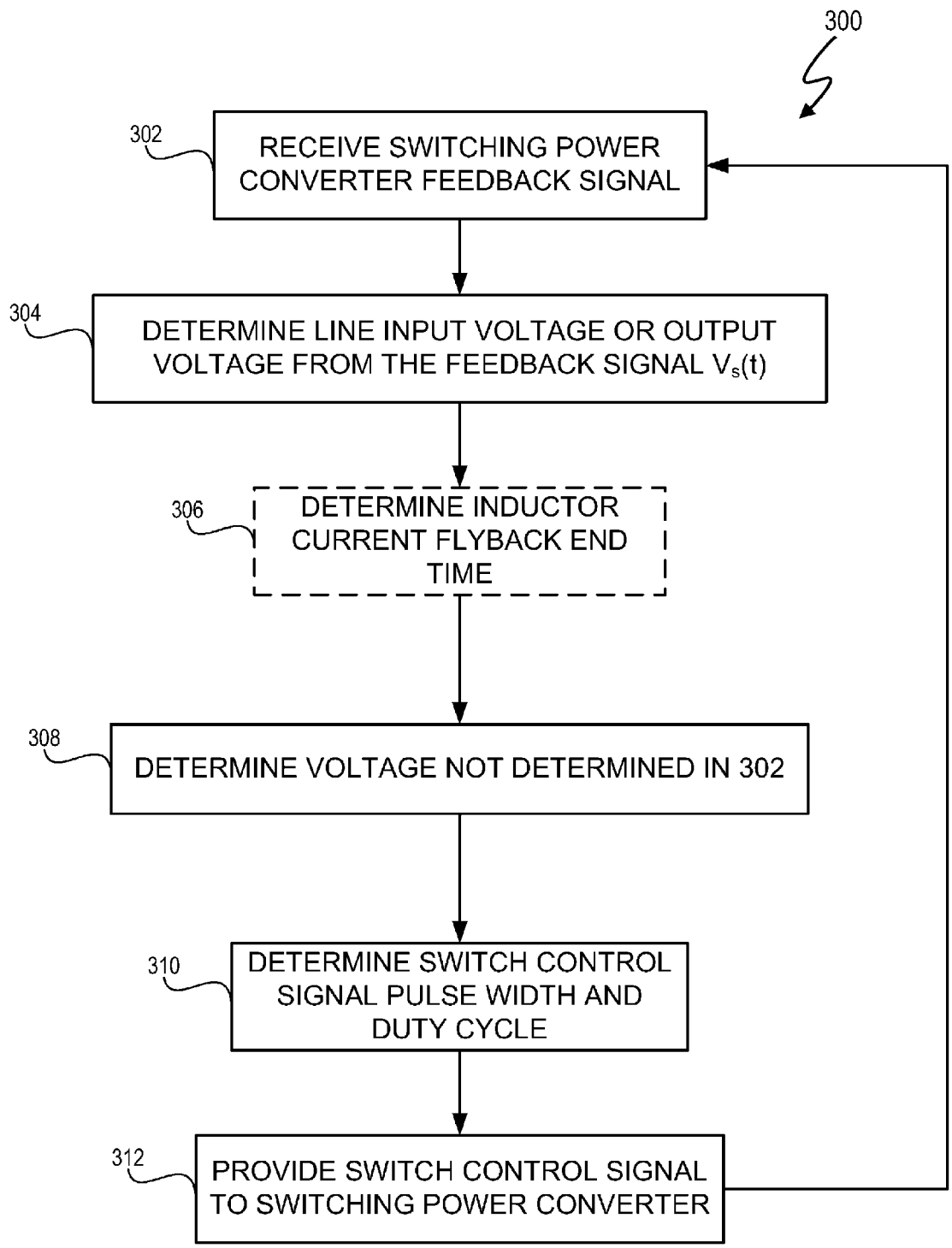
FIG. 3 depicts a power factor correction and output voltage regulation process.

FIG. 3 depicts an exemplary PFC and output voltage regulation process 300. In at least one embodiment, PFC and output voltage controllers 202A, 202B, 202C, and 202D (generically referred to as "PFC and output voltage controller 202") operate in accordance with PFC and output voltage regulation process 300 to determine the line input voltage $V_x(t)$ and the output voltage $V_c(t)$ of switching power converter 102, to control power factor correction, and to regulate the output voltage $V_c(t)$ of switching power converter 102. In operation 302, the PFC and output voltage controller 202 receives feedback signal $V_S(t)$ from the SWITCH NODE of switching power converter 201. The PFC and output voltage controller 202 can determine the line input voltage $V_x(t)$ or the output voltage $V_c(t)$ from the feedback signal $V_S(t)$. The PFC and output voltage regulation process 300 can be implemented in hardware or in software and executed by a processor of PFC and output voltage controller 202.

In at least one embodiment, the maximum, nominal voltage of feedback signals $V_S(t)$ and $V_c(t)$ depend upon the voltage demand of load 112. For example, if load 112 is a 12 V motor, the feedback signal $V_S(t)$ will have a maximum nominal value of 12 V; if load 112 is a light emitting diode based fixture, the feedback signal $V_S(t)$ may have a nominal value of 400 V, and so on. The exact maximum, nominal voltage of feedback signal $V_S(t)$ at SWITCH NODE typically varies slightly from the output voltage $V_c(t)$ due to system impedances, such as a voltage drop across diode 111.

In at least one embodiment of the PFC and output voltage controller 202, analog circuitry is used to generate the control signal $CS_1$, and the feedback signal $V_S(t)$ and the secondary feedback signal for power control systems 202A, 202B, and 202D can be fed directly into the analog circuitry. In at least one embodiment, PFC and output voltage controller 202 is implemented as an integrated circuit (IC), and input signals to PFC and output voltage controller 202 are voltage or current limited to prevent damaging PFC and output voltage controller 202. Thus, in at least one embodiment, power control system 200A, 200B, 200C, and 200D (generically referred to as "power control system 200") include at least one sensor/converter 206 to convert the feedback signals to a maximum value, such as +1 V, that can be received directly by an integrated circuit implemented PFC and output voltage controller 202. The sensor/converter 206 can be implemented separately from PFC and output voltage controller 202 or as a wholly or partially integrated component of PFC and output voltage controller 202.

Figure 4:
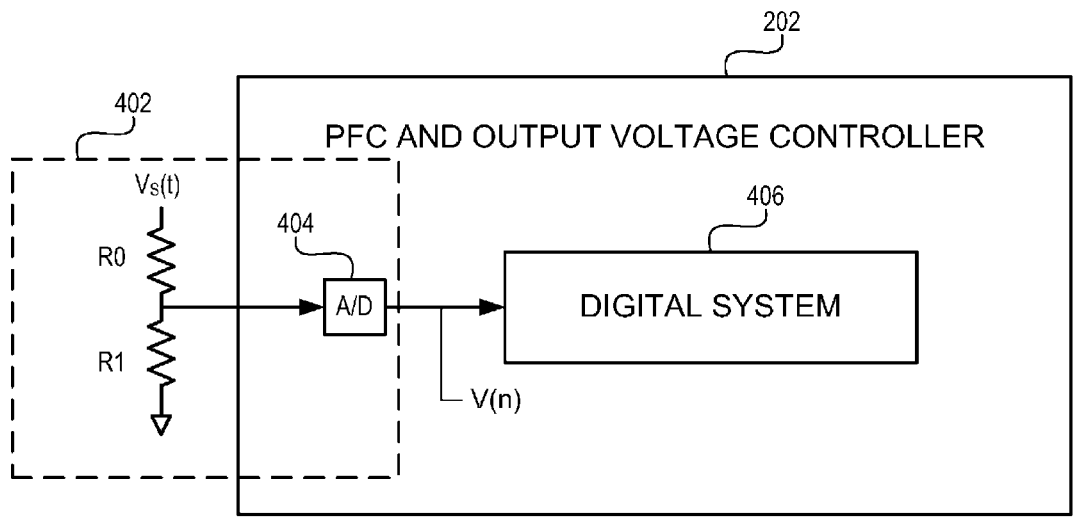
FIGS. 4 and 5 depict sensor/converters.
Figure 5:
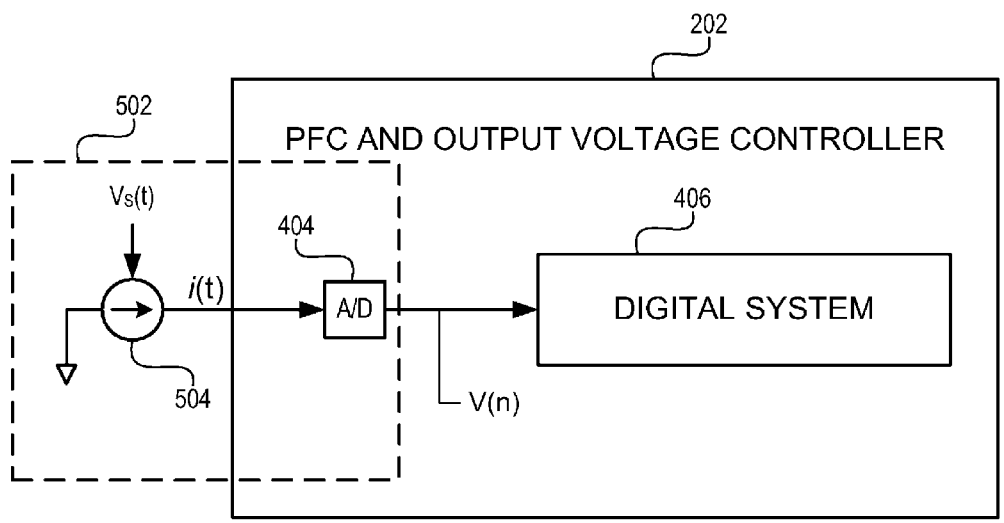

FIGS. 4 and 5 depict respective, exemplary sensors/converters. Sensor/converter 402 represents one embodiment of sensor/converter 206. Sensor/converter 402 represents a voltage divider/analog-to-digital system. Sensor/converter 402 includes a resistive voltage divider R0/R1 to step down feedback signal $V_S(t)$ to levels usable by PFC and output voltage controller 202. The resistance values of R0 and R1 depend upon the voltage coupled across R0 and R1 and the input voltage and current levels to be received by PFC and output voltage controller 202. In one embodiment, resistor R0 is 399 kohms, and resistor R1 is 1 kohm. Sensor/converter circuit 402 also includes an analog-to-digital (A/D) converter 404 to convert the analog output voltage across resistor R1 into a representative digital feedback signal V(n) usable by digital system 406, and "n" indicates a particular sample. In at least one embodiment, digital system 406 represents processing, driver, and other functions of PFC and output voltage controller 202.

FIG. 5 depicts a current-source and A/D sensor/converter 502. Sensor/converter 502 represents another embodiment of sensor/converter 206. Sensor/converter 502 includes a current-source 504 that provides a current-output signal i(t) to A/D converter 404. The value of current-output signal i(t) corresponds to the feedback signal $V_S(t)$. Sensor/converter 502 also includes A/D 404 to convert the output signal i(t) into a representative digital feedback signal V(n) usable by digital system 406.

Figure 6:
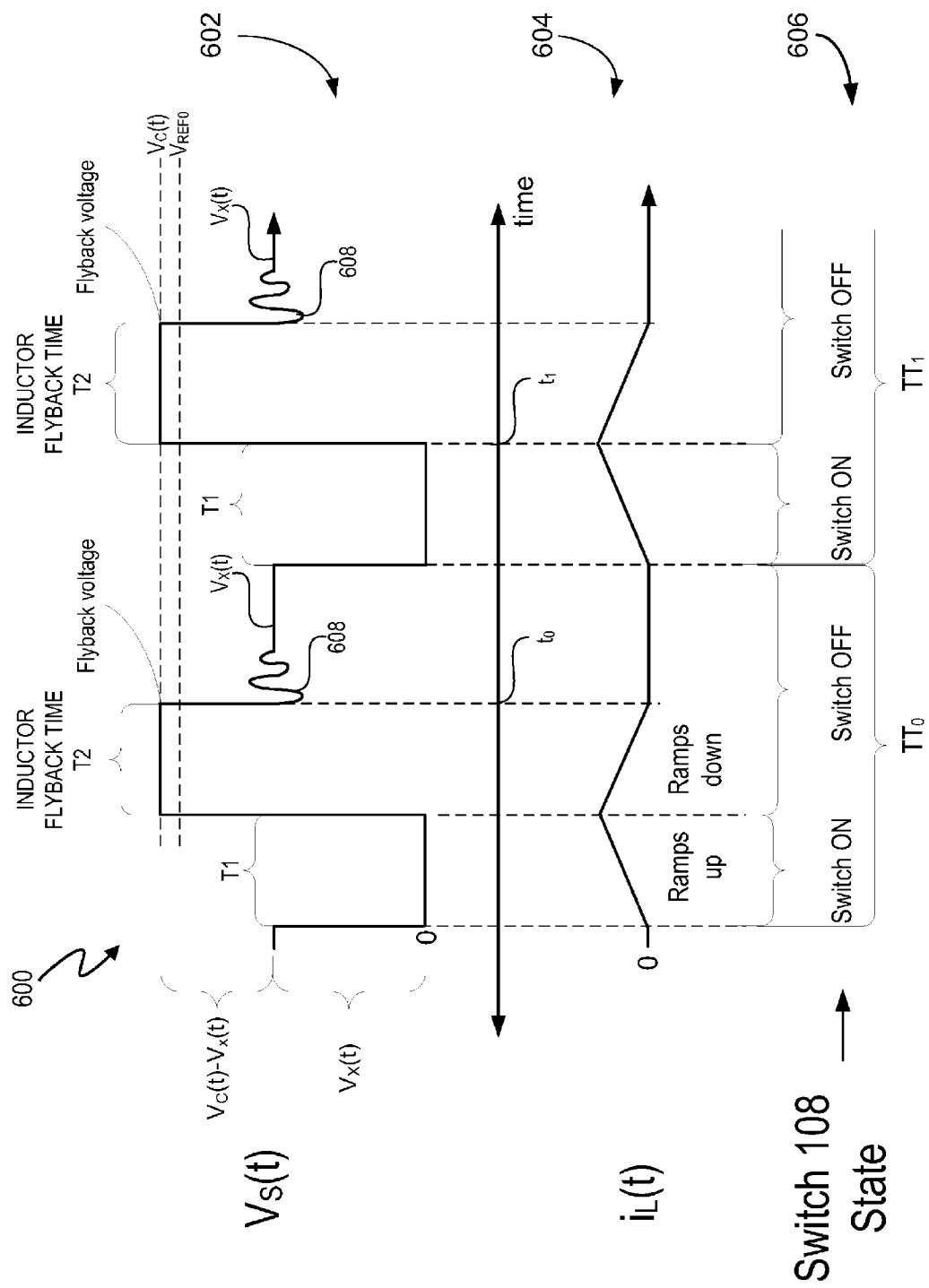
FIG. 6 depicts a time domain graph of a voltage feedback signal, an inductor current $i_L$, and corresponding states of a switching power converter switch.

FIG. 6 depicts time domain graphs 600 of (i) the voltage feedback signal $V_S(t)$ from the SWITCH NODE (graph 602), (ii) inductor current $i_L$ (graph 604), and (iii) corresponding states of switch 108 (graph 606). Referring to FIGS. 2A, 2B, 2C, 2D (generically referred to as "FIG. 2") and FIG. 6, the state of switch 108 is controlled by control signal $CS_1$. Control signal $CS_1$ has a frequency equal to $1/TT_x$, where $TT_x$ is the period of control signal $CS_1$ for the $x^{th}$ frame, and "x" is an integer marker. The frequency $f_{CS1}$ of control signal $CS_1$ can be controlled by PFC and output voltage controller 202. In at least one embodiment, PFC and output voltage controller 202 varies the frequency $f_{CS1}$ to provide a regulated output voltage $V_c(t)$ and in accordance with a predetermined spread spectrum strategy to, for example, reduce electromagnetic interference emissions. The frequency of control signal $CS_1$ is preferably between 20 kHz and 150 kHz, which respectively avoids audio frequencies and inefficient switching frequencies.

During an inductor current $i_L$ ramp-up time interval T1, i.e. when switch 108 is "ON", the inductor current $i_L$ ramps up and the voltage $V_S(t)$ at the SWITCH NODE decreases to approximately 0. The voltage $V_S(t)$ decreases to "approximately" 0 because small, non-ideal voltage drops can occur, such as a voltage drop across switch 108 when switch 108 is conducting or a voltage drop across diode 111, so that voltage of feedback signal $V_S(t)$ differs from, for example, line input voltage $V_x(t)$ or output voltage $V_c(t)$ by such non-ideal voltage drops. However, unless otherwise indicated, for purposes of this application determining or obtaining a line input voltage $V_x(t)$ and/or an output voltage $V_S(t)$ of switching power converter 201 includes determining or obtaining an approximate or scaled line input voltage and/or an approximate or scaled output voltage of switching power converter 201.

During inductor flyback time interval T2 when switch 108 is "OFF" (i.e. nonconductive), diode 111 conducts, the inductor current $i_L$ ramps down to zero (0) amps, and the voltage $V_S(t)$ increases to $V_c(t)$. After the inductor current $i_L$ ramps down to zero (0) amps, diode 111 stops conducting, the voltage drop across inductor 110 is approximately zero, and the voltage of feedback signal $V_S(t)$ equals $V_x(t)$. When the inductor current $i_L$ reaches zero, parasitic impedances, such as the parasitic capacitance across inductor 110, cause a decaying ripple 608 at the SWITCH NODE.

Referring to FIGS. 2, 3, and 6, PFC and output voltage controller 202 processes the feedback signal $V_S(t)$ in accordance with operation 304. Operation 304 determines from the feedback signal $V_S(t)$: (i) the output voltage $V_c(t)$ for PFC and output voltage controller 202A, (ii) the line input voltage $V_x(t)$ for PFC and output voltage controller 202B, and (iii) the line input voltage $V_x(t)$ or the output voltage $V_c(t)$ for PFC and output voltage controllers 202C and 202D. Whether operation 304 determines the line input voltage $V_x(t)$ or the output voltage $V_c(t)$ from feedback signal $V_S(t)$ for PFC and output voltage controllers 202C and 202D is a design choice. For PFC and output voltage controllers 202C and 202D, generally, the output voltage $V_c(t)$ can be obtained for all power output settings of switching power converter 201, i.e. for minimum and maximum pulse widths of control signal $CS_1$. However, the ripple 608 can cause difficulties in determining the line input voltage $V_x(t)$ during maximum output power settings, i.e. maximum pulse width of control signal $CS_1$, because the ripple 608 may not subside prior to the next cycle of control signal $CS_1$.

If the line input voltage $V_x(t)$ is determined by operation 304, the PFC and output voltage controller 202 is configured to determine the output voltage $V_c(t)$ in operation 308. If the output voltage $V_c(t)$ is determined by operation 304, the PFC and output voltage controller 202 is configured to determine the line input voltage in operation 308. The switch 108 ON time, i.e. the pulse width of control signal $CS_1$, is set by PFC and output voltage controller 202 during each period of control signal $CS_1$, and, thus, the inductor current $i_L$ ramp-up time interval T1 is known.

The PFC and output voltage controllers 202A and 202C determine the output voltage $V_c(t)$ from the feedback signal $V_S(t)$ by sensing the feedback signal $V_S(t)$ during inductor flyback time interval T2. In at least one embodiment, the duration of inductor flyback time interval T2 is unknown. Accordingly, switching power converter 201 waits a sufficient amount of time after the end of time interval T1 to allow any transient signals to dissipate and then determines the output voltage $V_c(t)$ from the feedback signal $V_S(t)$. As previously described, the feedback signal $V_S(t)$ may represent a scaled version of the output voltage $V_c(t)$. The scaling can be accounted for by switching power converter 201. Accordingly, unless otherwise indicated, determining the output voltage $V_c(t)$ includes determining a scaled or approximate version of the output voltage $V_c(t)$.

The PFC and output voltage controllers 202B and 202C determine the line input voltage $V_x(t)$ from the feedback signal $V_S(t)$ by sensing the feedback signal $V_S(t)$ after the inductor flyback time interval T2. Accordingly, in at least one embodiment, when determining the line input voltage $V_x(t)$ from the feedback signal $V_S(t)$ (as subsequently described), operation 306 determines the inductor flyback time interval T2 prior to operation 304. To determine the line input voltage $V_x(t)$ directly from the feedback signal $V_S(t)$, the feedback signal $V_S(t)$ can be sensed during a period of control signal $CS_1$ any time after inductor flyback time interval T2 and prior to the beginning of the time interval T1 for the next period of control signal $CS_1$ to determine line input voltage $V_x(t)$. In at least one embodiment, the feedback signal $V_S(t)$ is sensed after the ripple signal 608 dissipates so as to obtain a more accurate value of line input voltage $V_x(t)$ and sufficiently prior to the beginning of the next period of control signal $CS_1$ to allow the switching power converter 201 to perform operations 308, 310, and 312. In at least one embodiment, the switching power converter 201 determines the line input voltage $V_x(t)$ immediately after the inductor flyback time interval T2 by averaging the feedback signal $V_S(t)$. As with the output voltage $V_c(t)$, in at least one embodiment, the scaling can be accounted for by switching power converter 201. Accordingly, unless otherwise indicated, determining the line input voltage $V_x(t)$ includes determining a scaled or approximate version of the line input voltage $V_x(t)$.

Referring to FIGS. 2D and 6, PFC and output voltage controller 202D can determine line input voltage $V_x(t)$, output voltage $V_c(t)$, or both from second feedback signal $V_2(t)$. During time interval T1, switch 108 conducts, and the feedback signal $V_2(t)$ equals $-V_x(t) \cdot k$. $k = n_S/n_P$, "$n_S$" is the number of windings in the second winding 1206, "$n_P$" is the number of windings in the inductor 110. Thus, operation 304 can determine the line input voltage $V_x(t)$ by sensing the feedback signal $V_2(t)$ during time interval T1 and dividing the feedback signal by $-k$. The PFC and output voltage controller 202D can determine the output voltage $V_c(t)$ from feedback signal $V_2(t)$ once line input voltage $V_x(t)$ is determined. During inductor flyback time interval T2, the feedback signal $V_S(t)$ relates to the output voltage $V_c(t)$ and line input voltage $V_x(t)$ in accordance with Equation [2]:

$$V_2(t) = (V_c(t) - V_x(t)) \cdot k \qquad \text{Equation [2].}$$

The PFC and output voltage controller 202D can determine any combination of the line input voltage $V_x(t)$ and output voltage $V_c(t)$ from feedback signals $V_S(t)$ and $V_2(t)$ to obtain primary and redundant values of the line input voltage $V_x(t)$ and output voltage $V_c(t)$.

Figure 7:
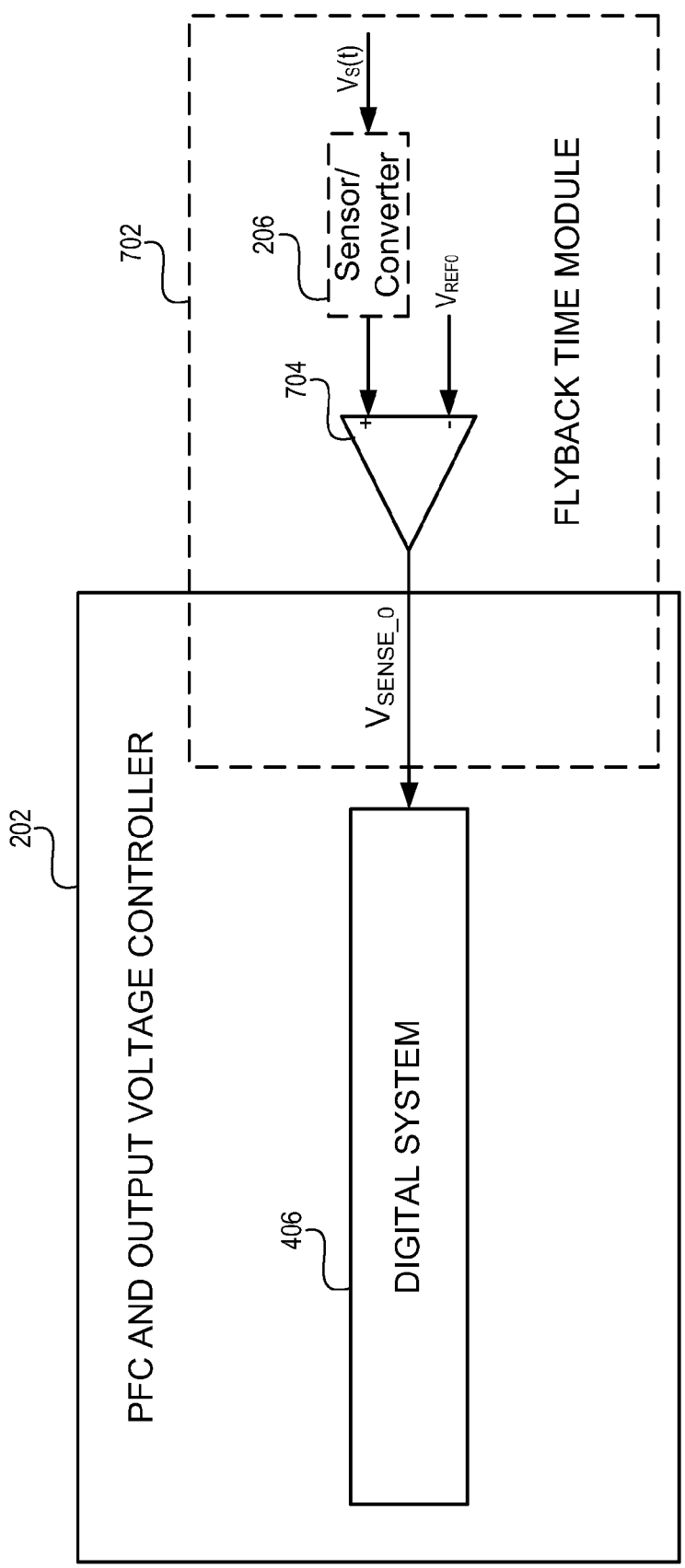
FIG. 7 depicts an inductor flyback end time determination module.

FIG. 7 depicts one embodiment of an inductor flyback end time interval determination module (referred to herein as a "flyback end time module") 702 to determine the end of the inductor flyback time interval T2 in operation 306. The inductor flyback end time interval T2 can be determined by the flyback time module 702 by, for example, sensing the feedback signal $V_S(t)$ at the beginning of time interval T2, detecting the transition at time $t_x$ of voltage $V_S(t)$ to $V_x(t)$, where "x" is a marker representing a particular period of control signal $CS_1$. Flyback end time module 702 can be implemented separately from PFC and output voltage controller 202 or as a wholly or partially integrated component of PFC and output voltage controller 202. Operation 306 is shown in dashed lines, because, in at least one embodiment, operation 306 is not used by PFC and output voltage controller 202A or 202D when the line input voltage $V_x(t)$ is determined from the second feedback signal ($V_x(t)$ in FIG. 202A and $V_2(t)$ in FIG. 202D).

Flyback time module 702 includes a comparator 704 to compare the feedback signal $V_S(t)$ with a predetermined reference voltage $V_{REF0}$ and provide an output signal $V_{SENSE\_0}$. The output signal $V_{SENSE\_0}$ transitions from one logical state to another (in this embodiment from HIGH to LOW) when voltage $V_S(t)$ decreases below the reference voltage $V_{REF0}$, which occurs at the end of inductor flyback time interval T2. Thus, the comparison of feedback signal $V_S(t)$ and $V_{REF0}$ allows the flyback time module 702 to sense a transition of the feedback signal $V_S(t)$ from the output voltage $V_c(t)$ level towards the line input voltage $V_x(t)$ level and determine the end of inductor flyback time interval T2. The reference voltage $V_{REF0}$ is set between $V_c(t)$ and $V_x(t)$. In at least one embodiment, the reference voltage $V_{REF0}$ is set below any expected transients in the feedback signal $V_S(t)$ during inductor flyback time interval T2 and high enough so that the value of comparator output signal $V_{SENSE\_0}$ transitions quickly at the end of inductor flyback time interval T2.

In at least one embodiment, the comparator 704 is implemented separately from the integrated PFC and output voltage controller 202. In another embodiment, comparator 704 is integrated with PFC and output voltage controller 202 (i.e. "on-chip"), and sensor/converter 206 modifies feedback signal $V_S(t)$ into a level usable by PFC and output voltage controller 202. In this embodiment, the reference voltage $V_{REF0}$ is also scaled to the same degree as feedback signal $V_S(t)$. The transition of the comparator output signal $V_{SENSE\_0}$ of comparator 704 from logical HIGH to logical LOW indicates an end of the inductor flyback time interval T2.

Operation 308 determines whichever voltage, i.e. the line input voltage $V_x(t)$ or the output voltage $V_c(t)$, which was not determined in operation 304.

Operation 310 determines the pulse width PW and duty cycle D of switch control signal $CS_1$. The PFC and output voltage controller 202 controls the pulse width PW and period T of control signal $C_{S1}$. Switching power converter 201 represents a nonlinear process because the power delivered by the switching power converter 201 is related to a square of the line input voltage $V_x(t)$. PFC and output voltage controller 202 controls the nonlinear process of switching power converter 201 so that a desired amount of energy is transferred to capacitor 106. The desired amount of energy depends upon the voltage and current requirements of load 112. The duty cycle of control signal $CS_1$ is set to maintain the desired output voltage $V_C(t)$ and load voltage $V_L(t)$, and, in at least one embodiment, the duty cycle D of control signal $CS_1$ equals $[V_L(t)/(V_C(t)+V_L(t))]$. Energy transfer increases during a period of time as the line input voltage $V_x(t)$ increases.

To regulate the amount of energy transferred and maintain a power factor correction close to one, PFC and output voltage controller 202 varies the period of control signal $CS_1$ so that the inductor current $i_L$ tracks the changes in line input voltage $V_x(t)$ and holds the output voltage $V_C(t)$ constant. Thus, as the line input voltage $V_x(t)$ increases, PFC and output voltage controller 202 increases the period TT (FIG. 6) of control signal $CS_1$, and as the line input voltage $V_x(t)$ decreases, PFC and output voltage controller 202 decreases the period TT (FIG. 6) of control signal $CS_1$. At the same time, the pulse width PW of control signal $CS_1$ is adjusted to maintain a constant duty cycle D, and, thus, hold the output voltage $V_C(t)$ constant. In at least one embodiment, the PFC and output voltage controller 202 updates the control signal $CS_1$ at a frequency much greater than the frequency of line input voltage $V_x(t)$. The frequency of line input voltage $V_x(t)$ is generally 50-60 Hz. The frequency 1/T of control signal $CS_1$ is, for example, between 20 kHz and 150 kHz. Frequencies at or above 20 kHz avoids audio frequencies and at or below 150 kHz avoids significant switching inefficiencies while still maintaining good power factor correction, e.g. between 0.9 and 1, and an approximately constant output voltage $V_C(t)$.

Figure 8:
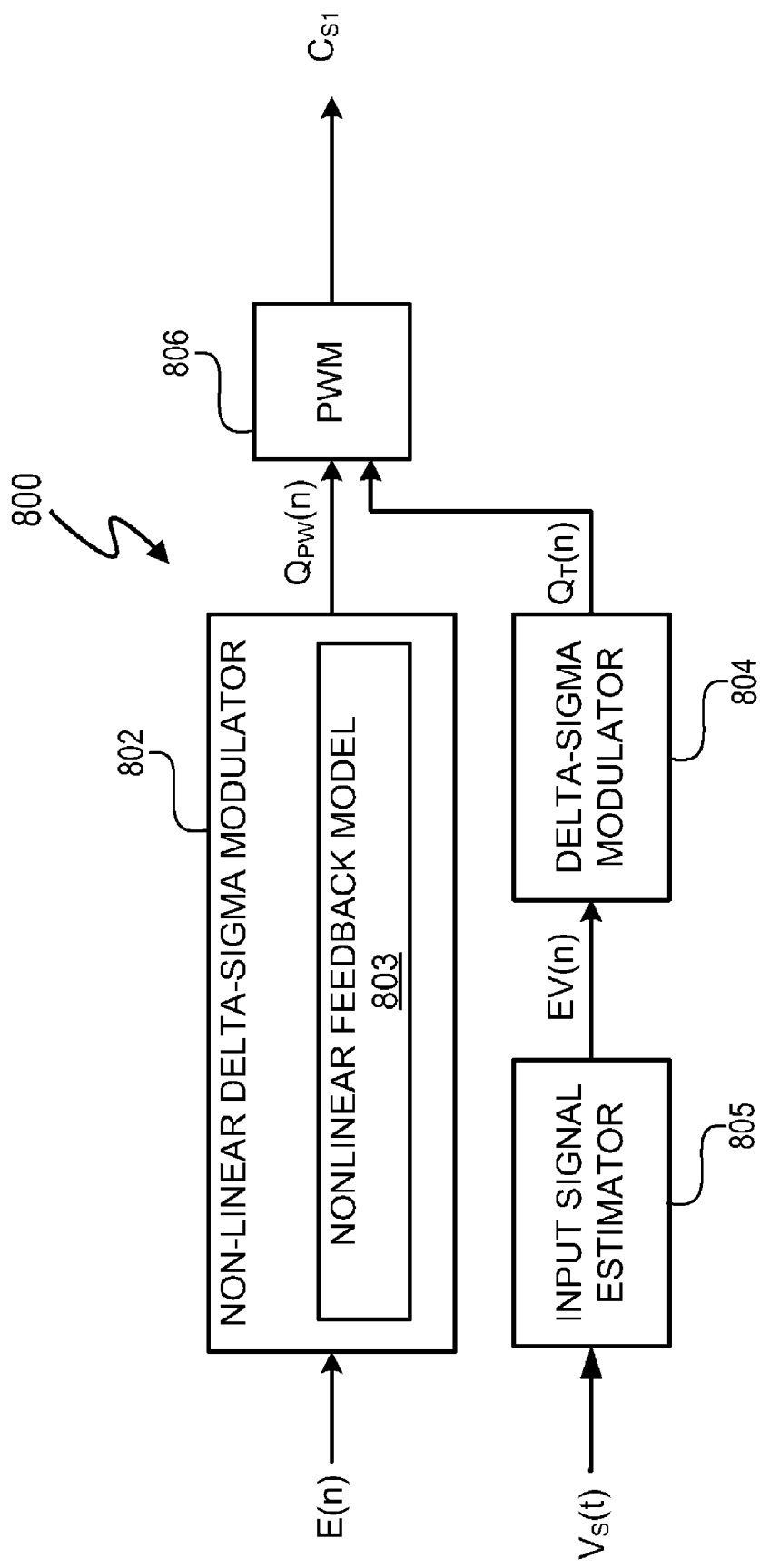
FIG. 8 depicts a PFC and output voltage controller.

FIG. 8 depicts PFC and output voltage controller 800, which represents one embodiment of PFC and output voltage controller 202. The PFC and output voltage controller 800 generates the control signal $CS_1$ to control the nonlinear energy transfer process of switching power converter 201. A nonlinear delta-sigma modulator 802 receives an energy input signal E(n) indicating a desired amount of energy transfer during the next cycle of control signal $CS_1$ to maintain a desired output voltage $V_c(t)$. The nonlinear delta-sigma modulator 802 processes the energy input signal E(n) and generates a quantizer output signal $Q_{PW}$. A nonlinear feedback model 803 of nonlinear delta-sigma modulator 802 models the nonlinear energy transfer process of switching power converter 201 so that the quantizer output signal $Q_{PW}$ represents a pulse width for control signal $CS_1$ that matches the energy transfer needed by capacitor 106 to maintain an approximately constant output voltage $V_c(t)$. Exemplary embodiments of PFC and output voltage controller 800 and nonlinear feedback model 803 are described in more detail in U.S. patent application Ser. No. 11/865,032, entitled "Control System Using A Nonlinear Delta-Sigma Modulator With Nonlinear Process Modeling", inventor John L. Melanson, and filing date Sep. 30, 2007 ("Melanson III") and in U.S. patent application Ser. No. 11/967,269 entitled "Power Control System Using a Nonlinear Delta-Sigma Modulator With Nonlinear Power Conversion Process Modeling", inventor John L. Melanson, assignee Cirrus Logic, Inc., ("Melanson IV"). Melanson III and Melanson IV are incorporated herein by reference in their entireties.

In at least one embodiment, line input signal $V_x(t)$ is a rectified voltage and, thus, rises and falls over time. The PFC and output voltage controller 800 is configured to track the changes in line input signal $V_x(t)$ and adjust the period of control signal $CS_1$ to increase as line input signal $V_x(t)$ increases and to decrease as line input signal $V_x(t)$ decreases. To determine each period of control signal $CS_1$, PFC and output voltage controller 800 includes an input signal estimator 805 to estimate the instantaneous values of line input voltage $V_x(t)$ for each cycle of control signal $CS_1$ and generate an estimated voltage value EV(n). In at least one embodiment, the input signal estimator 805 performs operation 304 to determine the line input voltage $V_x(t)$ from the feedback signal $V_S(t)$. The PFC and output voltage controller 800 includes a conventional delta-sigma modulator 804 to process the estimated voltage value EV(n) and convert the estimated voltage value EV(n) into a quantizer output signal $Q_T$. The quantizer output signal $Q_T$ represents a period of control signal $CS_1$ for the estimated value of line input voltage $V_x(t)$. Exemplary conventional delta-sigma modulator design and operation is described in the book *Understanding Delta-Sigma Data Converters* by Schreier and Temes, IEEE Press, 2005, ISBN 0-471-46585-2.

The PFC and output voltage controller 800 includes a pulse width modulator 806 to convert the quantizer output signal $Q_{PW}(n)$ into a pulse width and quantizer output signal $Q_T(n)$ into a period for control signal $CS_1$, where n can be a number representing a particular instance of the associated variable. To perform the conversions, in at least one embodiment, pulse with modulator 806 includes a counter. The quantizer output signal $Q_{PW}(n)$ indicates that number of counts for the pulse width of control signal $CS_1$, and the quantizer output signal $Q_T(n)$ indicates the number of counts for the period of control signal $CS_1$. The pulse width modulator 806 translates the number of counts for the quantizer output signal $Q_{PW}(n)$ and the quantizer output signal $Q_T(n)$ into the respective pulse width and period of control signal $CS_1$. In at least one embodiment, PFC and output voltage controller 800 is implemented using digital technology. In other embodiments, PFC and output voltage controller 800 can be implemented using analog or mixed digital and analog technology.

Referring to FIGS. 2 and 8, when nonlinear delta-sigma modulator 802 is used as part of a PFC and output voltage controller, such as PFC and output voltage controller 800 (FIG. 8), for maintaining power factor correction, the energy input signal E(n) is proportional to $(1-(V_x(t)/V_C(t))\cdot K$. "K" is a constant representing power demand by load 112 as determined by a proportional integral compensator (not shown) that compares the output voltage $V_c(t)$ to a reference voltage and determines a feedback signal that is a combination of an integral and proportionate function of the output voltage error. An example of a proportional integral compensator is described in Alexander Prodić, "Compensator Design and Stability Assessment for Fast Voltage Loops of Power Factor Correction Rectifiers", IEEE Transactions on Power Electronics, Vol. 22, No. 5, September 2007 and Erickson and Maksomović, "Fundamentals of Power Electronics", $2^{nd}$ ed., Boston, Mass.: Kluwer, 2000, which is incorporated herein by reference in its entirety. In at least one embodiment, the energy input signal E(n) is constrained to ensure that switching power converter 201 operates in discontinuous current mode.

Operation 312 provides the switch control signal $CS_1$ to switching power converter 201. After operation 312, PFC and output voltage regulation process 300 returns to operation 302 for the next period of control signal $CS_1$.

Figure 9:
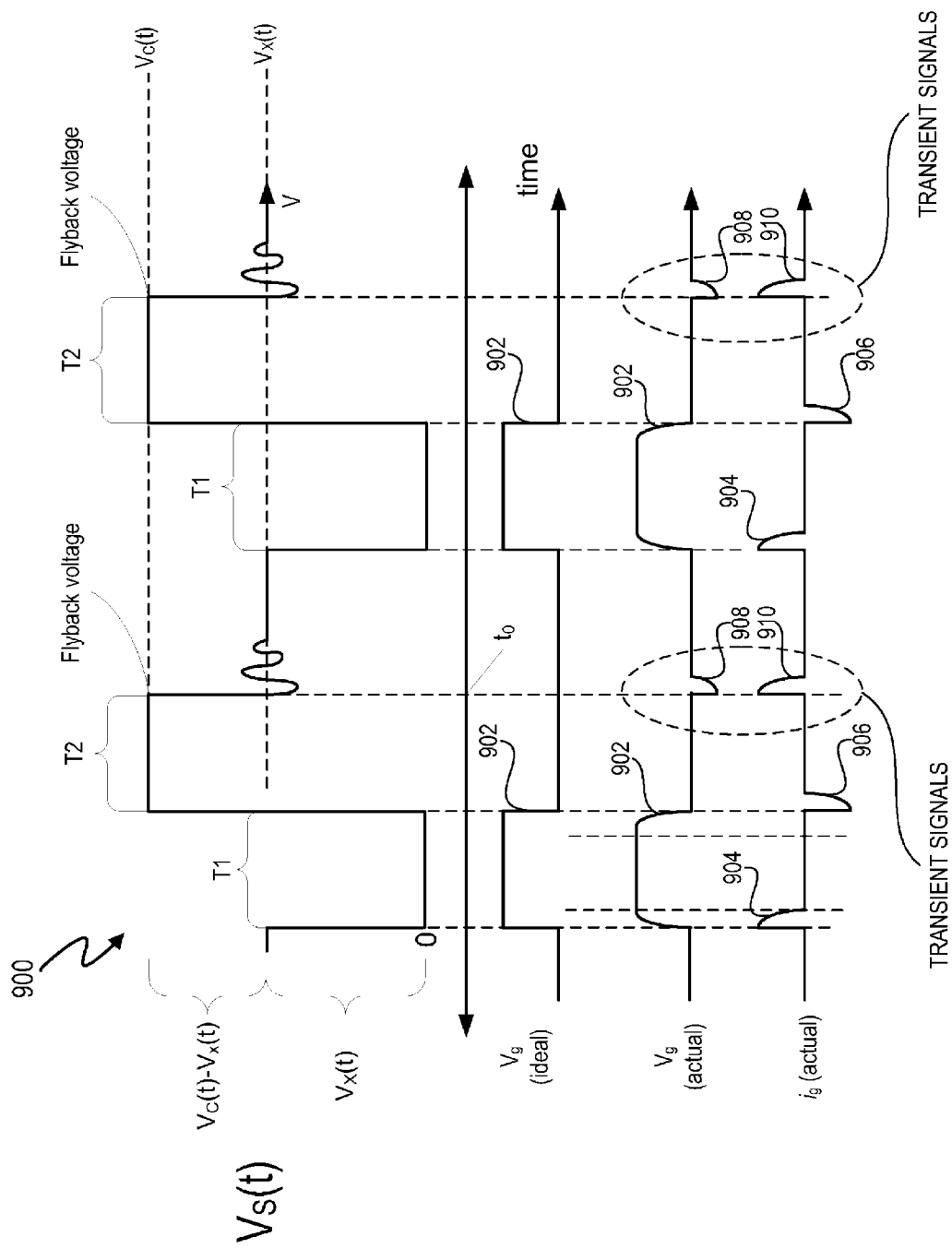
FIG. 9 depicts a graph of a feedback signal and corresponding ideal and actual gate voltages and actual currents of a switching power converter switch.

In at least one embodiment, operation 306 determines the end of inductor flyback time interval T2 by monitoring the gate charge characteristics of switch 108 to detect the end of inductor flyback time interval T2. FIG. 9 depicts a graph 900 of feedback signal $V_S(t)$ and corresponding ideal and actual gate voltages $V_g$ and actual gate currents $i_g$. Referring to FIGS. 2 and 9, ideally during each period of control signal $CS_1$, the gate voltage $V_g$ has a logical HIGH pulse 902 corresponding to the switch 108 ON time and is otherwise a logical LOW. Likewise, ideally during each period of control signal $CS_1$, the gate current $i_g$ has a brief pulse 904 to charge the gate of switch 108 and has a brief pulse 906 to discharge the gate of switch 108. Ideally, pulses 904 and 906 are the only pulses of the gate current $i_g$. However, the switch 108 has a parasitic gate-to-drain Miller capacitance. The parasitic capacitance causes transient voltage signals 908 and transient current signals 910 at the gate of switch 108 when the feedback signal $V_S(t)$ at the SWITCH NODE transitions from voltage $V_c(t)$ to voltage $V_x(t)$ at the end of the inductor flyback time interval T2. (The transient signals are not necessarily drawn to scale in FIG. 9, and the magnitudes of the transient signals will vary depending upon the components used to implement switching power converter 201.) In at least one embodiment, the transient current signals, transient voltage signals, or both can be detected by respective embodiments of the PFC and output voltage controller 202. Thus, PFC and output voltage controller 202 in operation 306 can determine end of the inductor flyback time interval T2 by detecting the transient signal(s) 908.

Figure 10:
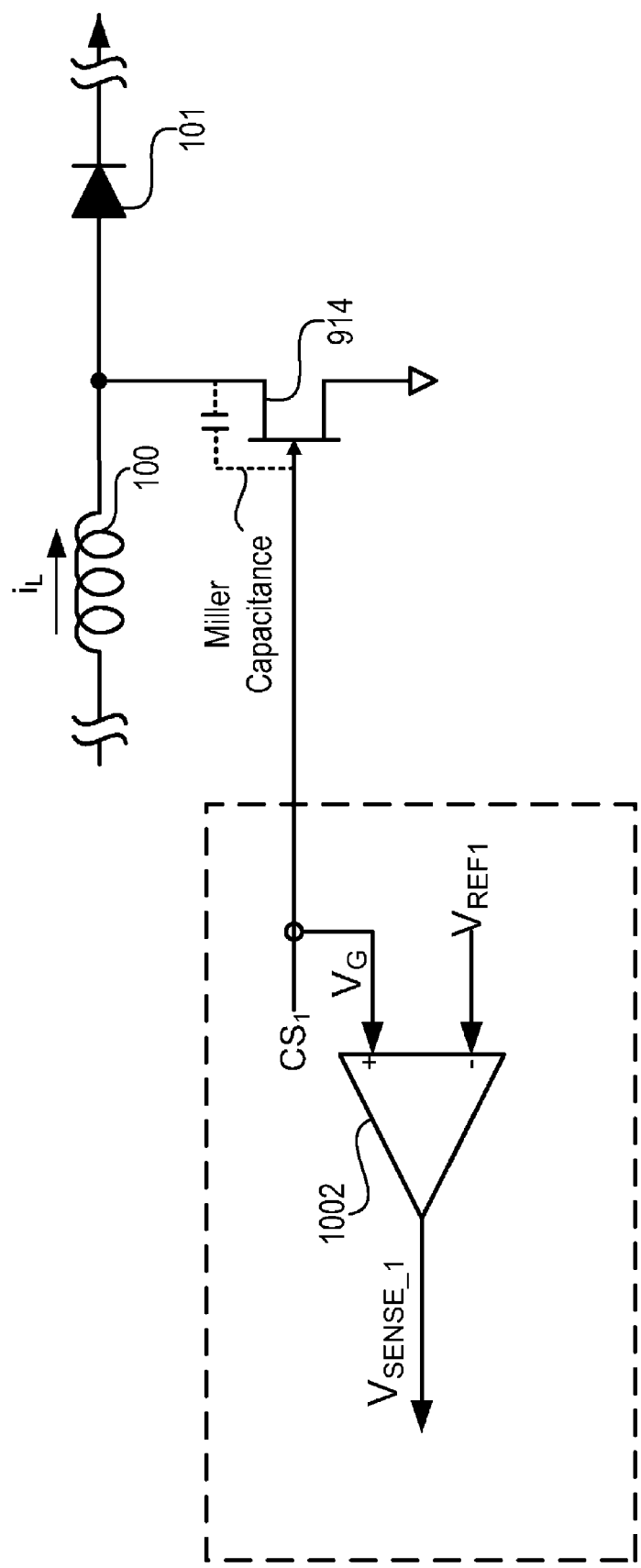
FIG. 10 depicts an inductor flyback end time interval determination module.

FIG. 10 depicts an exemplary inductor flyback end time interval determination module ("flyback end time module") 1000 to determine the end of inductor flyback time interval T2 using the transient voltage signal 908. In at least one embodiment, the PFC and output voltage controller 906 includes flyback time module 1000. The flyback time module 1000 detects the gate voltage $V_g$, and comparator 1002 compares the gate voltage with a reference voltage $V_{REF1}$. The reference voltage $V_{REF1}$ is predetermined and set between the steady state gate voltage $V_g$ during the inductor flyback time interval T2 and the minimum voltage of the transient 908. In at least one embodiment, $V_{REF1}$ is set at −0.5 V. When the feedback signal $V_S(t)$ transitions from voltage $V_c(t)$ to voltage $V_x(t)$, the gate voltage $V_g$ transient 1008 decreases below the reference voltage $V_{REF1}$, and the output signal $V_{SENSE\_1}$ of comparator 1002 changes from a logical HIGH to a logical LOW. The transition of the comparator output signal $V_{SENSE\_1}$ of comparator 1002 from logical HIGH to logical LOW indicates an end of the inductor flyback time interval T2.

Thus, during a single period of the control signal, embodiments of the PFC and output voltage controller obtain the line input voltage and output voltage of the switching power converter using a single feedback signal received from the switching power converter.

Although the present invention has been described in detail, it should be understood that various changes, substitutions and alterations can be made hereto without departing from the spirit and scope of the invention as defined by the appended claims.

What is claimed is:

1. A power factor correction (PFC) controller to control power factor correction of a switching power converter, wherein the switching power converter receives a periodic input signal and the switching power converter includes an inductor coupled to an input node and a switch node, a switch coupled to the switch node, and an output node coupled to a capacitor, the PFC controller comprising:
   a first input terminal, coupled to the switch node, to receive a feedback signal from the switch node, wherein the feedback signal from the switch node is distinct from a signal on the output node for a cycle of the input signal; and
   wherein the PFC controller is configured to:
   determine from the feedback signal at least one of (i) the line input voltage and (ii) an output voltage of the switching power converter;
   determine at least one of (i) the line input voltage and (ii) the output voltage of the switching power converter; and
   provide a control signal to the switch to control power factor correction of the switching power converter in response to the determined line input voltage and the determined output voltage of the switching power converter.

2. The PFC controller of claim 1 wherein the PFC controller is further configured to determine both the line input voltage and the output voltage of the switching power converter from the feedback signal.

3. The PFC controller of claim 1 wherein the PFC controller is further configured to determine at least one of (i) the line input voltage and (ii) the output voltage of the switching power converter from a feedback signal received from a secondary winding magnetically coupled to the inductor.

4. The PFC controller of claim 1 wherein the PFC controller further comprises a second input terminal coupled to an input node of the switching power converter to receive the line input voltage, and the PFC controller is further configured to determine the output voltage of the switching power converter from the feedback signal.

5. The PFC controller of claim 1 wherein the PFC controller further comprises a second input terminal coupled to an output node of the switching power converter to receive the output voltage of the switching power converter, and the PFC controller is further configured to determine the line input voltage of the switching power converter from the feedback signal.

6. The PFC controller of claim 1 wherein, during operation of the PFC controller and the switching power converter, for each period of a switch control signal the switch conducts for a time interval T1 and the PFC controller is configured to determine the output voltage of the switching power converter from a value of the feedback signal sensed during the time interval T1.

7. The PFC controller of claim 1 wherein, during operation of the PFC controller and the switching power converter, for each period of a switch control signal the switch conducts for a time interval T1 and, after the time interval T1, current in the inductor decreases for a flyback time interval T2, wherein the PFC controller is configured to determine the line input voltage from a value of the feedback signal sensed during the flyback time interval T2.

8. The PFC controller of claim 1 wherein the PFC controller further comprises a second input terminal coupled to the switching power converter and, during operation of the PFC controller and the switching power converter, the second input terminal receives a voltage sensed across the inductor and the PFC controller is configured to determine at least one of (i) the line input voltage and (ii) the output voltage of the switching power converter from the voltage sensed across the inductor.

9. The PFC controller of claim 8 wherein the voltage sensed across the inductor is sensed using a secondary winding magnetically coupled to the inductor.

10. A power factor correction (PFC) controller to control power factor correction and regulate output voltage at an output node of a switching power converter, the PFC controller comprising:
   an input to receive a feedback signal from the switching power converter; and
   wherein the PFC controller is configured to:
      determine a line input voltage and an output voltage of the switching power converter from the feedback signal, wherein during operation of the PFC controller the feedback signal is distinct from a signal on the output node of the switching power converter for a cycle of an input voltage signal supplied to the switching power converter; and
      provide a control signal to the switching power converter to control power factor correction and regulate output voltage of the switching power converter in response to the determined line input voltage and the determined output voltage of the switching power converter.

11. A method of controlling power factor correction of a switching power converter, wherein the switching power converter receives a periodic input signal and the switching power converter includes an inductor coupled to an input node and a switch node, a switch coupled to the switch node, and an output node coupled to a capacitor, the method comprising:
   receiving a feedback signal from the switch node, wherein the feedback signal from the switch node is distinct from a signal on the output node for a cycle of the input signal;
   determining from the feedback signal at least one of (i) the line input voltage and (ii) an output voltage of the switching power converter;
   determining at least one of (i) the line input voltage and (ii) the output voltage of the switching power converter; and
   providing a control signal to the switch to control power factor correction of the switching power converter in response to the determined line input voltage and the determined output voltage of the switching power converter.

12. The method of claim 11 further comprising:
   determining both the line input voltage and the output voltage of the switching power converter from the feedback signal.

13. The method of claim 11 further comprising:
   determining at least one of (i) the line input voltage and (ii) the output voltage of the switching power converter from a feedback signal received from a secondary winding magnetically coupled to the inductor.

14. The method of claim 11 further comprising:
   determining the output voltage of the switching power converter from the feedback signal.

15. The method of claim 11 further comprising:
   determining the line input voltage of the switching power converter from the feedback signal.

16. The method of claim 11 wherein for each period of a switch control signal the switch conducts for a time interval T1, the method further comprising:
   determining the output voltage of the switching power converter from a value of the feedback signal sensed during the time interval T1.

17. The method of claim 11 wherein for each period of a switch control signal the switch conducts for a time interval T1 and, after the time interval T1, current in the inductor decreases for a flyback time interval T2, the method further comprising:
   determining the line input voltage from a value of the feedback signal sensed during the flyback time interval T2.

18. The method of claim 11 further comprising:
   receiving a voltage sensed across the inductor; and
   determining at least one of (i) the line input voltage and (ii) the output voltage of the switching power converter from the voltage sensed across the inductor.

19. The method of claim 11 further comprising:
   sensing the voltage across the inductor using a secondary winding magnetically coupled to the inductor.

20. An apparatus to control power factor correction of a switching power converter, wherein the switching power converter receives a periodic input signal and the switching power converter includes an inductor coupled to an input node and a switch node, a switch coupled to the switch node, and an output node coupled to a capacitor, the apparatus comprising:
   means for receiving a feedback signal from the switch node, wherein the feedback signal from the switch node is distinct from a signal on the output node for a cycle of the input signal;
   means for determining from the feedback signal at least one of (i) the line input voltage and (ii) an output voltage of the switching power converter;
   means for determining at least one of (i) the line input voltage and (ii) the output voltage of the switching power converter; and
   means for providing a control signal to the switch to control power factor correction of the switching power converter in response to the determined line input voltage and the determined output voltage of the switching power converter.

* * * * *